(12) United States Patent
Sokolov et al.

(10) Patent No.: US 8,832,354 B2
(45) Date of Patent: Sep. 9, 2014

(54) USE OF HOST SYSTEM RESOURCES BY MEMORY CONTROLLER

(75) Inventors: Dotan Sokolov, Ra'anana (IL); Barak Rotbard, Tel Aviv (IL)

(73) Assignee: Apple Inc., Cupertino, CA (US)

( * ) Notice: Subject to any disclaimer, the term of this patent is extended or adjusted under 35 U.S.C. 154(b) by 787 days.

(21) Appl. No.: 12/728,287

(22) Filed: Mar. 22, 2010

(65) Prior Publication Data

US 2010/0250836 A1      Sep. 30, 2010

Related U.S. Application Data

(60) Provisional application No. 61/163,133, filed on Mar. 25, 2009.

(51) Int. Cl.
*G06F 12/00*    (2006.01)
*G06F 13/00*    (2006.01)
*G06F 13/28*    (2006.01)
*G06F 12/02*    (2006.01)
*G11C 16/10*    (2006.01)

(52) U.S. Cl.
CPC .... *G06F 12/0246* (2013.01); *G06F 2212/7211* (2013.01); *G06F 2212/1041* (2013.01); *G06F 2212/7205* (2013.01); *G06F 2212/7201* (2013.01); *G06F 2212/7203* (2013.01); *G11C 16/10* (2013.01)
USPC .......................................... 711/103; 711/104

(58) Field of Classification Search
CPC . G06F 12/0866; G06F 12/08; G06F 12/0246; G06F 2212/1041; G06F 2212/7201; G06F 2212/7205; G06F 2212/7207; G06F 2212/7211
USPC .................................. 711/103, 104
See application file for complete search history.

(56) References Cited

U.S. PATENT DOCUMENTS

| | | | |
|---|---|---|---|
| 3,668,631 A | 6/1972 | Griffith et al. | |
| 3,668,632 A | 6/1972 | Oldham | |

(Continued)

FOREIGN PATENT DOCUMENTS

| | | |
|---|---|---|
| EP | 0783754 B1 | 7/1997 |
| EP | 1434236 B1 | 6/2004 |

(Continued)

OTHER PUBLICATIONS

U.S. Appl. No. 12/323,544 Office Action dated Dec. 13, 2011.

(Continued)

*Primary Examiner* — Matthew Bradley
*Assistant Examiner* — Rocio Del Mar Perez-Velez
(74) *Attorney, Agent, or Firm* — Meyertons, Hood, Kivlin, Kowert & Goetzel, P.C.

(57) ABSTRACT

A method for data storage includes, in a system that includes a host having a host memory and a memory controller that is separate from the host and stores data for the host in a non-volatile memory including multiple analog memory cells, storing in the host memory information items relating to respective groups of the analog memory cells of the non-volatile memory. A command that causes the memory controller to access a given group of the analog memory cells is received from the host. In response to the command, a respective information item relating to the given group of the analog memory cells is retrieved from the host memory by the memory controller, and the given group of the analog memory cells is accessed using the retrieved information item.

32 Claims, 2 Drawing Sheets

(56) References Cited

U.S. PATENT DOCUMENTS

| | | |
|---|---|---|
| 4,058,851 A | 11/1977 | Scheuneman |
| 4,112,502 A | 9/1978 | Scheuneman |
| 4,394,763 A | 7/1983 | Nagano et al. |
| 4,413,339 A | 11/1983 | Riggle et al. |
| 4,556,961 A | 12/1985 | Iwahashi et al. |
| 4,558,431 A | 12/1985 | Satoh |
| 4,608,687 A | 8/1986 | Dutton |
| 4,654,847 A | 3/1987 | Dutton |
| 4,661,929 A | 4/1987 | Aoki et al. |
| 4,768,171 A | 8/1988 | Tada |
| 4,811,285 A | 3/1989 | Walker et al. |
| 4,899,342 A | 2/1990 | Potter et al. |
| 4,910,706 A | 3/1990 | Hyatt |
| 4,993,029 A | 2/1991 | Galbraith et al. |
| 5,056,089 A | 10/1991 | Furuta et al. |
| 5,077,722 A | 12/1991 | Geist et al. |
| 5,126,808 A | 6/1992 | Montalvo et al. |
| 5,163,021 A | 11/1992 | Mehrotra et al. |
| 5,172,338 A | 12/1992 | Mehrotra et al. |
| 5,182,558 A | 1/1993 | Mayo |
| 5,182,752 A | 1/1993 | Deroo et al. |
| 5,191,584 A | 3/1993 | Anderson |
| 5,200,959 A | 4/1993 | Gross et al. |
| 5,237,535 A | 8/1993 | Mielke et al. |
| 5,272,669 A | 12/1993 | Samachisa et al. |
| 5,276,649 A | 1/1994 | Hoshita et al. |
| 5,287,469 A | 2/1994 | Tsuboi |
| 5,365,484 A | 11/1994 | Cleveland et al. |
| 5,388,064 A | 2/1995 | Khan |
| 5,416,646 A | 5/1995 | Shirai |
| 5,416,782 A | 5/1995 | Wells et al. |
| 5,446,854 A | 8/1995 | Khalidi et al. |
| 5,450,424 A | 9/1995 | Okugaki et al. |
| 5,469,444 A | 11/1995 | Endoh et al. |
| 5,473,753 A | 12/1995 | Wells et al. |
| 5,479,170 A | 12/1995 | Cauwenberghs et al. |
| 5,508,958 A | 4/1996 | Fazio et al. |
| 5,519,831 A | 5/1996 | Holzhammer |
| 5,532,962 A | 7/1996 | Auclair et al. |
| 5,533,190 A | 7/1996 | Binford et al. |
| 5,541,886 A | 7/1996 | Hasbun |
| 5,600,677 A | 2/1997 | Citta et al. |
| 5,638,320 A | 6/1997 | Wong et al. |
| 5,657,332 A | 8/1997 | Auclair et al. |
| 5,675,540 A | 10/1997 | Roohparvar |
| 5,682,352 A | 10/1997 | Wong et al. |
| 5,687,114 A | 11/1997 | Khan |
| 5,696,717 A | 12/1997 | Koh |
| 5,726,649 A | 3/1998 | Tamaru et al. |
| 5,726,934 A | 3/1998 | Tran et al. |
| 5,742,752 A | 4/1998 | De Koening |
| 5,748,533 A | 5/1998 | Dunlap et al. |
| 5,748,534 A | 5/1998 | Dunlap et al. |
| 5,751,637 A | 5/1998 | Chen et al. |
| 5,761,402 A | 6/1998 | Kaneda et al. |
| 5,798,966 A | 8/1998 | Keeney |
| 5,799,200 A | 8/1998 | Brant et al. |
| 5,801,985 A | 9/1998 | Roohparvar et al. |
| 5,802,069 A * | 9/1998 | Coulson ............... 714/718 |
| 5,838,832 A | 11/1998 | Barnsley |
| 5,860,106 A | 1/1999 | Domen et al. |
| 5,867,114 A | 2/1999 | Barbir |
| 5,867,428 A | 2/1999 | Ishii et al. |
| 5,867,429 A | 2/1999 | Chen et al. |
| 5,877,986 A | 3/1999 | Harari et al. |
| 5,889,937 A | 3/1999 | Tamagawa |
| 5,901,089 A | 5/1999 | Korsh et al. |
| 5,909,449 A | 6/1999 | So et al. |
| 5,912,906 A | 6/1999 | Wu et al. |
| 5,930,167 A | 7/1999 | Lee et al. |
| 5,937,424 A | 8/1999 | Leak et al. |
| 5,942,004 A | 8/1999 | Cappelletti |
| 5,946,716 A | 8/1999 | Karp et al. |
| 5,969,986 A | 10/1999 | Wong et al. |
| 5,982,668 A | 11/1999 | Ishii et al. |
| 5,991,517 A | 11/1999 | Harari et al. |
| 5,995,417 A | 11/1999 | Chen et al. |
| 6,009,014 A | 12/1999 | Hollmer et al. |
| 6,009,016 A | 12/1999 | Ishii et al. |
| 6,023,425 A | 2/2000 | Ishii et al. |
| 6,034,891 A | 3/2000 | Norman |
| 6,040,993 A | 3/2000 | Chen et al. |
| 6,041,430 A | 3/2000 | Yamauchi |
| 6,073,204 A | 6/2000 | Lakhani et al. |
| 6,101,614 A | 8/2000 | Gonzales et al. |
| 6,128,237 A | 10/2000 | Shirley et al. |
| 6,134,140 A | 10/2000 | Tanaka et al. |
| 6,134,143 A | 10/2000 | Norman |
| 6,134,631 A | 10/2000 | Jennings |
| 6,141,261 A | 10/2000 | Patti |
| 6,151,246 A | 11/2000 | So et al. |
| 6,157,573 A | 12/2000 | Ishii et al. |
| 6,166,962 A | 12/2000 | Chen et al. |
| 6,169,691 B1 | 1/2001 | Pasotti et al. |
| 6,178,466 B1 | 1/2001 | Gilbertson et al. |
| 6,185,134 B1 | 2/2001 | Tanaka et al. |
| 6,209,113 B1 | 3/2001 | Roohparvar |
| 6,212,654 B1 | 4/2001 | Lou et al. |
| 6,219,276 B1 | 4/2001 | Parker |
| 6,219,447 B1 | 4/2001 | Lee et al. |
| 6,222,762 B1 | 4/2001 | Guterman et al. |
| 6,230,233 B1 | 5/2001 | Lofgren et al. |
| 6,240,458 B1 | 5/2001 | Gilbertson |
| 6,259,627 B1 | 7/2001 | Wong |
| 6,275,419 B1 | 8/2001 | Guterman et al. |
| 6,278,632 B1 | 8/2001 | Chevallier |
| 6,279,069 B1 | 8/2001 | Robinson et al. |
| 6,288,944 B1 | 9/2001 | Kawamura |
| 6,292,394 B1 | 9/2001 | Cohen et al. |
| 6,301,151 B1 | 10/2001 | Engh et al. |
| 6,304,486 B1 | 10/2001 | Yano |
| 6,307,776 B1 | 10/2001 | So et al. |
| 6,314,044 B1 | 11/2001 | Sasaki et al. |
| 6,317,363 B1 | 11/2001 | Guterman et al. |
| 6,317,364 B1 | 11/2001 | Guterman et al. |
| 6,345,004 B1 | 2/2002 | Omura et al. |
| 6,360,346 B1 | 3/2002 | Miyauchi et al. |
| 6,363,008 B1 | 3/2002 | Wong |
| 6,363,454 B1 | 3/2002 | Lakhani et al. |
| 6,366,496 B1 | 4/2002 | Torelli et al. |
| 6,385,092 B1 | 5/2002 | Ishii et al. |
| 6,392,932 B1 | 5/2002 | Ishii et al. |
| 6,396,742 B1 | 5/2002 | Korsh et al. |
| 6,397,364 B1 | 5/2002 | Barkan |
| 6,405,323 B1 | 6/2002 | Lin et al. |
| 6,405,342 B1 | 6/2002 | Lee |
| 6,418,060 B1 | 7/2002 | Yong et al. |
| 6,442,585 B1 | 8/2002 | Dean et al. |
| 6,445,602 B1 | 9/2002 | Kokudo et al. |
| 6,452,838 B1 | 9/2002 | Ishii et al. |
| 6,456,528 B1 | 9/2002 | Chen |
| 6,466,476 B1 | 10/2002 | Wong et al. |
| 6,467,062 B1 | 10/2002 | Barkan |
| 6,469,931 B1 | 10/2002 | Ban et al. |
| 6,480,948 B1 | 11/2002 | Virajpet et al. |
| 6,490,236 B1 | 12/2002 | Fukuda et al. |
| 6,522,580 B2 | 2/2003 | Chen et al. |
| 6,525,952 B2 | 2/2003 | Araki et al. |
| 6,532,556 B1 | 3/2003 | Wong et al. |
| 6,538,922 B1 | 3/2003 | Khalid et al. |
| 6,549,464 B2 | 4/2003 | Tanaka et al. |
| 6,553,510 B1 | 4/2003 | Pekny et al. |
| 6,558,967 B1 | 5/2003 | Wong |
| 6,560,152 B1 | 5/2003 | Cernea |
| 6,567,311 B2 | 5/2003 | Ishii et al. |
| 6,577,539 B2 | 6/2003 | Iwahashi |
| 6,584,012 B2 | 6/2003 | Banks |
| 6,615,307 B1 | 9/2003 | Roohparvar |
| 6,621,739 B2 | 9/2003 | Gonzales et al. |
| 6,640,326 B1 | 10/2003 | Buckingham et al. |
| 6,643,169 B2 | 11/2003 | Rudelic et al. |
| 6,646,913 B2 | 11/2003 | Micheloni et al. |
| 6,678,192 B2 | 1/2004 | Gongwer et al. |
| 6,683,811 B2 | 1/2004 | Ishii et al. |

(56) References Cited

U.S. PATENT DOCUMENTS

| | | | |
|---|---|---|---|
| 6,687,155 B2 | 2/2004 | Nagasue | |
| 6,707,748 B2 | 3/2004 | Lin et al. | |
| 6,708,257 B2 | 3/2004 | Bao | |
| 6,714,449 B2 | 3/2004 | Khalid | |
| 6,717,847 B2 | 4/2004 | Chen | |
| 6,731,557 B2 | 5/2004 | Beretta | |
| 6,732,250 B2 | 5/2004 | Durrant | |
| 6,738,293 B1 | 5/2004 | Iwahashi | |
| 6,751,766 B2 | 6/2004 | Guterman et al. | |
| 6,757,193 B2 | 6/2004 | Chen et al. | |
| 6,774,808 B1 | 8/2004 | Hibbs et al. | |
| 6,781,877 B2 | 8/2004 | Cernea et al. | |
| 6,804,805 B2 | 10/2004 | Rub | |
| 6,807,095 B2 | 10/2004 | Chen et al. | |
| 6,807,101 B2 | 10/2004 | Ooishi et al. | |
| 6,809,964 B2 | 10/2004 | Moschopoulos et al. | |
| 6,819,592 B2 | 11/2004 | Noguchi et al. | |
| 6,829,167 B2 | 12/2004 | Tu et al. | |
| 6,845,052 B1 | 1/2005 | Ho et al. | |
| 6,851,018 B2 | 2/2005 | Wyatt et al. | |
| 6,851,081 B2 | 2/2005 | Yamamoto | |
| 6,856,546 B2 | 2/2005 | Guterman et al. | |
| 6,862,218 B2 | 3/2005 | Guterman et al. | |
| 6,870,767 B2 | 3/2005 | Rudelic et al. | |
| 6,870,773 B2 | 3/2005 | Noguchi et al. | |
| 6,873,552 B2 | 3/2005 | Ishii et al. | |
| 6,879,520 B2 | 4/2005 | Hosono et al. | |
| 6,882,567 B1 | 4/2005 | Wong | |
| 6,894,926 B2 | 5/2005 | Guterman et al. | |
| 6,907,497 B2 | 6/2005 | Hosono et al. | |
| 6,925,009 B2 | 8/2005 | Noguchi et al. | |
| 6,930,925 B2 | 8/2005 | Guo et al. | |
| 6,934,188 B2 | 8/2005 | Roohparvar | |
| 6,937,511 B2 | 8/2005 | Hsu et al. | |
| 6,958,938 B2 | 10/2005 | Noguchi et al. | |
| 6,963,505 B2 | 11/2005 | Cohen | |
| 6,972,993 B2 | 12/2005 | Conley et al. | |
| 6,988,175 B2 | 1/2006 | Lasser | |
| 6,992,932 B2 | 1/2006 | Cohen | |
| 6,999,344 B2 | 2/2006 | Hosono et al. | |
| 7,002,843 B2 | 2/2006 | Guterman et al. | |
| 7,006,379 B2 | 2/2006 | Noguchi et al. | |
| 7,012,835 B2 | 3/2006 | Gonzales et al. | |
| 7,020,017 B2 | 3/2006 | Chen et al. | |
| 7,023,735 B2 | 4/2006 | Ban et al. | |
| 7,031,210 B2 | 4/2006 | Park et al. | |
| 7,031,214 B2 | 4/2006 | Tran | |
| 7,031,216 B2 | 4/2006 | You | |
| 7,039,846 B2 | 5/2006 | Hewitt et al. | |
| 7,042,766 B1 | 5/2006 | Wang et al. | |
| 7,054,193 B1 | 5/2006 | Wong | |
| 7,054,199 B2 | 5/2006 | Lee et al. | |
| 7,057,958 B2 | 6/2006 | So et al. | |
| 7,065,147 B2 | 6/2006 | Ophir et al. | |
| 7,068,539 B2 | 6/2006 | Guterman et al. | |
| 7,071,849 B2 | 7/2006 | Zhang | |
| 7,072,222 B2 | 7/2006 | Ishii et al. | |
| 7,079,555 B2 | 7/2006 | Baydar et al. | |
| 7,088,615 B2 | 8/2006 | Guterman et al. | |
| 7,099,194 B2 | 8/2006 | Tu et al. | |
| 7,102,924 B2 | 9/2006 | Chen et al. | |
| 7,113,432 B2 | 9/2006 | Mokhlesi | |
| 7,130,210 B2 | 10/2006 | Bathul et al. | |
| 7,139,192 B1 | 11/2006 | Wong | |
| 7,139,198 B2 | 11/2006 | Guterman et al. | |
| 7,145,805 B2 | 12/2006 | Ishii et al. | |
| 7,151,692 B2 | 12/2006 | Wu | |
| 7,158,058 B1 | 1/2007 | Yu | |
| 7,170,781 B2 | 1/2007 | So et al. | |
| 7,170,802 B2 | 1/2007 | Cernea et al. | |
| 7,173,859 B2 | 2/2007 | Hemink | |
| 7,177,184 B2 | 2/2007 | Chen | |
| 7,177,195 B2 | 2/2007 | Gonzales et al. | |
| 7,177,199 B2 | 2/2007 | Chen et al. | |
| 7,177,200 B2 | 2/2007 | Ronen et al. | |
| 7,184,338 B2 | 2/2007 | Nakagawa et al. | |
| 7,187,195 B2 | 3/2007 | Kim | |
| 7,187,592 B2 | 3/2007 | Guterman et al. | |
| 7,190,614 B2 | 3/2007 | Wu | |
| 7,193,898 B2 | 3/2007 | Cernea | |
| 7,193,921 B2 | 3/2007 | Choi et al. | |
| 7,196,644 B1 | 3/2007 | Anderson et al. | |
| 7,196,928 B2 | 3/2007 | Chen | |
| 7,196,933 B2 | 3/2007 | Shibata | |
| 7,197,594 B2 | 3/2007 | Raz et al. | |
| 7,200,062 B2 | 4/2007 | Kinsely et al. | |
| 7,210,077 B2 | 4/2007 | Brandenberger et al. | |
| 7,221,592 B2 | 5/2007 | Nazarian | |
| 7,224,613 B2 | 5/2007 | Chen et al. | |
| 7,231,474 B1 | 6/2007 | Helms et al. | |
| 7,231,562 B2 | 6/2007 | Ohlhoff et al. | |
| 7,243,275 B2 | 7/2007 | Gongwer et al. | |
| 7,254,690 B2 | 8/2007 | Rao | |
| 7,254,763 B2 | 8/2007 | Aadsen et al. | |
| 7,257,027 B2 | 8/2007 | Park | |
| 7,259,987 B2 | 8/2007 | Chen et al. | |
| 7,266,026 B2 | 9/2007 | Gongwer et al. | |
| 7,266,069 B2 | 9/2007 | Chu | |
| 7,269,066 B2 | 9/2007 | Nguyen et al. | |
| 7,272,757 B2 | 9/2007 | Stocken | |
| 7,274,611 B2 | 9/2007 | Roohparvar | |
| 7,277,355 B2 | 10/2007 | Tanzana | |
| 7,280,398 B1 | 10/2007 | Lee et al. | |
| 7,280,409 B2 | 10/2007 | Misumi et al. | |
| 7,280,415 B2 | 10/2007 | Hwang et al. | |
| 7,283,399 B2 | 10/2007 | Ishii et al. | |
| 7,289,344 B2 * | 10/2007 | Chen | 365/9 |
| 7,301,807 B2 | 11/2007 | Khalid et al. | |
| 7,301,817 B2 | 11/2007 | Li et al. | |
| 7,308,525 B2 | 12/2007 | Lasser et al. | |
| 7,310,255 B2 | 12/2007 | Chan | |
| 7,310,269 B2 | 12/2007 | Shibata | |
| 7,310,271 B2 | 12/2007 | Lee | |
| 7,310,272 B1 | 12/2007 | Mokhesi et al. | |
| 7,310,347 B2 | 12/2007 | Lasser | |
| 7,312,727 B1 | 12/2007 | Feng et al. | |
| 7,321,509 B2 | 1/2008 | Chen et al. | |
| 7,328,384 B1 | 2/2008 | Kulkarni et al. | |
| 7,342,831 B2 | 3/2008 | Mokhlesi et al. | |
| 7,343,330 B1 | 3/2008 | Boesjes et al. | |
| 7,345,924 B2 | 3/2008 | Nguyen et al. | |
| 7,345,928 B2 | 3/2008 | Li | |
| 7,349,263 B2 | 3/2008 | Kim et al. | |
| 7,356,755 B2 | 4/2008 | Fackenthal | |
| 7,363,420 B2 | 4/2008 | Lin et al. | |
| 7,365,671 B1 | 4/2008 | Anderson | |
| 7,388,781 B2 | 6/2008 | Litsyn et al. | |
| 7,397,697 B2 | 7/2008 | So et al. | |
| 7,405,974 B2 | 7/2008 | Yaoi et al. | |
| 7,405,979 B2 | 7/2008 | Ishii et al. | |
| 7,408,804 B2 | 8/2008 | Hemink et al. | |
| 7,408,810 B2 | 8/2008 | Aritome et al. | |
| 7,409,473 B2 | 8/2008 | Conley et al. | |
| 7,409,623 B2 | 8/2008 | Baker et al. | |
| 7,420,847 B2 | 9/2008 | Li | |
| 7,433,231 B2 | 10/2008 | Aritome | |
| 7,433,697 B2 | 10/2008 | Karaoguz et al. | |
| 7,434,111 B2 | 10/2008 | Sugiura et al. | |
| 7,437,498 B2 | 10/2008 | Ronen | |
| 7,440,324 B2 | 10/2008 | Mokhlesi | |
| 7,440,331 B2 | 10/2008 | Hemink | |
| 7,441,067 B2 | 10/2008 | Gorobetz et al. | |
| 7,447,970 B2 | 11/2008 | Wu et al. | |
| 7,450,421 B2 | 11/2008 | Mokhlesi et al. | |
| 7,453,737 B2 | 11/2008 | Ha | |
| 7,457,163 B2 | 11/2008 | Hemink | |
| 7,457,897 B1 | 11/2008 | Lee et al. | |
| 7,460,410 B2 | 12/2008 | Nagai et al. | |
| 7,460,412 B2 | 12/2008 | Lee et al. | |
| 7,466,592 B2 | 12/2008 | Mitani et al. | |
| 7,468,907 B2 | 12/2008 | Kang et al. | |
| 7,468,911 B2 | 12/2008 | Lutze et al. | |
| 7,469,049 B1 | 12/2008 | Feng | |
| 7,471,581 B2 | 12/2008 | Tran et al. | |

(56) References Cited

U.S. PATENT DOCUMENTS

| | | |
|---|---|---|
| 7,483,319 B2 | 1/2009 | Brown |
| 7,487,329 B2 | 2/2009 | Hepkin et al. |
| 7,487,394 B2 | 2/2009 | Forhan et al. |
| 7,492,641 B2 | 2/2009 | Hosono et al. |
| 7,508,710 B2 | 3/2009 | Mokhlesi |
| 7,526,711 B2 | 4/2009 | Orio |
| 7,539,061 B2 | 5/2009 | Lee |
| 7,539,062 B2 | 5/2009 | Doyle |
| 7,551,492 B2 | 6/2009 | Kim |
| 7,558,109 B2 | 7/2009 | Brandman et al. |
| 7,558,839 B1 | 7/2009 | McGovern |
| 7,568,135 B2 | 7/2009 | Cornwell et al. |
| 7,570,520 B2 | 8/2009 | Kamei et al. |
| 7,574,555 B2 | 8/2009 | Porat et al. |
| 7,590,002 B2 | 9/2009 | Mokhlesi et al. |
| 7,593,259 B2 | 9/2009 | Kim |
| 7,594,093 B1 | 9/2009 | Kancherla |
| 7,596,707 B1 | 9/2009 | Vemula |
| 7,609,787 B2 | 10/2009 | Jahan et al. |
| 7,613,043 B2 | 11/2009 | Cornwell et al. |
| 7,616,498 B2 | 11/2009 | Mokhlesi et al. |
| 7,619,918 B2 | 11/2009 | Aritome |
| 7,631,245 B2 | 12/2009 | Lasser |
| 7,633,798 B2 | 12/2009 | Sarin et al. |
| 7,633,802 B2 | 12/2009 | Mokhlesi |
| 7,639,532 B2 | 12/2009 | Roohparvar et al. |
| 7,644,347 B2 | 1/2010 | Alexander et al. |
| 7,656,734 B2 | 2/2010 | Thorp et al. |
| 7,660,158 B2 | 2/2010 | Aritome |
| 7,660,183 B2 | 2/2010 | Ware et al. |
| 7,661,000 B2 | 2/2010 | Ueda et al. |
| 7,661,054 B2 | 2/2010 | Huffman et al. |
| 7,665,007 B2 | 2/2010 | Yang et al. |
| 7,680,987 B1 | 3/2010 | Clark et al. |
| 7,733,712 B1 | 6/2010 | Walston et al. |
| 7,742,351 B2 | 6/2010 | Inoue et al. |
| 7,761,624 B2 | 7/2010 | Karamcheti et al. |
| 7,797,609 B2 | 9/2010 | Neuman |
| 7,810,017 B2 * | 10/2010 | Radke ............ 714/769 |
| 7,848,149 B2 | 12/2010 | Gonzales et al. |
| 7,869,273 B2 | 1/2011 | Lee et al. |
| 7,885,119 B2 | 2/2011 | Li |
| 7,904,783 B2 | 3/2011 | Brandman et al. |
| 7,928,497 B2 | 4/2011 | Yaegashi |
| 7,929,549 B1 | 4/2011 | Talbot |
| 7,930,515 B2 | 4/2011 | Gupta et al. |
| 7,945,825 B2 | 5/2011 | Cohen et al. |
| 7,978,516 B2 | 7/2011 | Olbrich et al. |
| 8,014,094 B1 | 9/2011 | Jin |
| 8,037,380 B2 | 10/2011 | Cagno et al. |
| 8,040,744 B2 | 10/2011 | Gorobets et al. |
| 8,065,583 B2 | 11/2011 | Radke |
| 8,099,543 B2 * | 1/2012 | Fisher ............ 711/103 |
| 2001/0002172 A1 | 5/2001 | Tanaka et al. |
| 2001/0006479 A1 | 7/2001 | Ikehashi et al. |
| 2002/0038440 A1 | 3/2002 | Barkan |
| 2002/0056064 A1 | 5/2002 | Kidorf et al. |
| 2002/0118574 A1 | 8/2002 | Gongwer et al. |
| 2002/0133684 A1 | 9/2002 | Anderson |
| 2002/0166091 A1 | 11/2002 | Kidorf et al. |
| 2002/0174295 A1 | 11/2002 | Ulrich et al. |
| 2002/0196510 A1 | 12/2002 | Hietala et al. |
| 2003/0002348 A1 | 1/2003 | Chen et al. |
| 2003/0103400 A1 | 6/2003 | Van Tran |
| 2003/0161183 A1 | 8/2003 | Van Tran |
| 2003/0189856 A1 | 10/2003 | Cho et al. |
| 2004/0057265 A1 | 3/2004 | Mirabel et al. |
| 2004/0057285 A1 | 3/2004 | Cernea et al. |
| 2004/0083333 A1 | 4/2004 | Chang et al. |
| 2004/0083334 A1 | 4/2004 | Chang et al. |
| 2004/0105311 A1 | 6/2004 | Cernea et al. |
| 2004/0114437 A1 | 6/2004 | Li |
| 2004/0160842 A1 | 8/2004 | Fukiage |
| 2004/0223371 A1 | 11/2004 | Roohparvar |
| 2005/0007802 A1 | 1/2005 | Gerpheide |
| 2005/0013165 A1 | 1/2005 | Ban |
| 2005/0024941 A1 | 2/2005 | Lasser et al. |
| 2005/0024978 A1 | 2/2005 | Ronen |
| 2005/0030788 A1 | 2/2005 | Parkinson et al. |
| 2005/0086574 A1 | 4/2005 | Fackenthal |
| 2005/0121436 A1 | 6/2005 | Kamitani et al. |
| 2005/0144361 A1 | 6/2005 | Gonzalez et al. |
| 2005/0157555 A1 | 7/2005 | Ono et al. |
| 2005/0162913 A1 | 7/2005 | Chen |
| 2005/0169051 A1 | 8/2005 | Khalid et al. |
| 2005/0189649 A1 | 9/2005 | Maruyama et al. |
| 2005/0213393 A1 | 9/2005 | Lasser |
| 2005/0224853 A1 | 10/2005 | Ohkawa |
| 2005/0240745 A1 | 10/2005 | Iyer et al. |
| 2005/0243626 A1 | 11/2005 | Ronen |
| 2006/0004952 A1 | 1/2006 | Lasser |
| 2006/0028875 A1 | 2/2006 | Avraham et al. |
| 2006/0028877 A1 | 2/2006 | Meir |
| 2006/0101193 A1 | 5/2006 | Murin |
| 2006/0106972 A1 | 5/2006 | Gorobets et al. |
| 2006/0107136 A1 | 5/2006 | Gongwer et al. |
| 2006/0129750 A1 | 6/2006 | Lee et al. |
| 2006/0133141 A1 | 6/2006 | Gorobets |
| 2006/0156189 A1 | 7/2006 | Tomlin |
| 2006/0179334 A1 | 8/2006 | Brittain et al. |
| 2006/0190699 A1 | 8/2006 | Lee |
| 2006/0203546 A1 | 9/2006 | Lasser |
| 2006/0218359 A1 | 9/2006 | Sanders et al. |
| 2006/0221692 A1 | 10/2006 | Chen |
| 2006/0221705 A1 | 10/2006 | Hemink et al. |
| 2006/0221714 A1 | 10/2006 | Li et al. |
| 2006/0239077 A1 | 10/2006 | Park et al. |
| 2006/0239081 A1 | 10/2006 | Roohparvar |
| 2006/0256620 A1 | 11/2006 | Nguyen et al. |
| 2006/0256626 A1 | 11/2006 | Werner et al. |
| 2006/0256891 A1 | 11/2006 | Yuan et al. |
| 2006/0271748 A1 | 11/2006 | Jain et al. |
| 2006/0285392 A1 | 12/2006 | Incarnati et al. |
| 2006/0285396 A1 | 12/2006 | Ha |
| 2007/0006013 A1 | 1/2007 | Moshayedi et al. |
| 2007/0019481 A1 | 1/2007 | Park |
| 2007/0033581 A1 | 2/2007 | Tomlin et al. |
| 2007/0047314 A1 | 3/2007 | Goda et al. |
| 2007/0047326 A1 | 3/2007 | Nguyen et al. |
| 2007/0050536 A1 | 3/2007 | Kolokowsky |
| 2007/0058446 A1 | 3/2007 | Hwang et al. |
| 2007/0061502 A1 | 3/2007 | Lasser et al. |
| 2007/0067667 A1 | 3/2007 | Ikeuchi et al. |
| 2007/0074093 A1 | 3/2007 | Lasser |
| 2007/0086239 A1 | 4/2007 | Litsyn et al. |
| 2007/0086260 A1 | 4/2007 | Sinclair |
| 2007/0089034 A1 | 4/2007 | Litsyn et al. |
| 2007/0091677 A1 | 4/2007 | Lasser et al. |
| 2007/0091694 A1 | 4/2007 | Lee et al. |
| 2007/0103978 A1 | 5/2007 | Conley et al. |
| 2007/0103986 A1 | 5/2007 | Chen |
| 2007/0104211 A1 | 5/2007 | Opsasnick |
| 2007/0109845 A1 | 5/2007 | Chen |
| 2007/0109849 A1 | 5/2007 | Chen |
| 2007/0115726 A1 | 5/2007 | Cohen et al. |
| 2007/0118713 A1 | 5/2007 | Guterman et al. |
| 2007/0143378 A1 | 6/2007 | Gorobetz |
| 2007/0143531 A1 | 6/2007 | Atri |
| 2007/0159889 A1 | 7/2007 | Kang et al. |
| 2007/0159892 A1 | 7/2007 | Kang et al. |
| 2007/0159907 A1 | 7/2007 | Kwak |
| 2007/0168837 A1 | 7/2007 | Murin |
| 2007/0171714 A1 | 7/2007 | Wu et al. |
| 2007/0183210 A1 | 8/2007 | Choi et al. |
| 2007/0189073 A1 | 8/2007 | Aritome |
| 2007/0195602 A1 | 8/2007 | Fong et al. |
| 2007/0206426 A1 | 9/2007 | Mokhlesi |
| 2007/0208904 A1 | 9/2007 | Hsieh et al. |
| 2007/0226599 A1 | 9/2007 | Motwani |
| 2007/0236990 A1 | 10/2007 | Aritome |
| 2007/0253249 A1 | 11/2007 | Kang et al. |
| 2007/0256620 A1 | 11/2007 | Viggiano et al. |
| 2007/0263455 A1 | 11/2007 | Cornwell et al. |
| 2007/0266232 A1 | 11/2007 | Rodgers et al. |

(56) References Cited

U.S. PATENT DOCUMENTS

| | | |
|---|---|---|
| 2007/0271424 A1 | 11/2007 | Lee et al. |
| 2007/0280000 A1 | 12/2007 | Fujiu et al. |
| 2007/0291571 A1 | 12/2007 | Balasundaram |
| 2007/0297234 A1 | 12/2007 | Cernea et al. |
| 2008/0010395 A1 | 1/2008 | Mylly et al. |
| 2008/0025121 A1 | 1/2008 | Tanzawa |
| 2008/0043535 A1 | 2/2008 | Roohparvar |
| 2008/0049504 A1 | 2/2008 | Kasahara et al. |
| 2008/0049506 A1 | 2/2008 | Guterman |
| 2008/0052446 A1 | 2/2008 | Lasser et al. |
| 2008/0055993 A1 | 3/2008 | Lee |
| 2008/0080243 A1 | 4/2008 | Edahiro et al. |
| 2008/0082730 A1 | 4/2008 | Kim et al. |
| 2008/0089123 A1 | 4/2008 | Chae et al. |
| 2008/0104309 A1 | 5/2008 | Cheon et al. |
| 2008/0104312 A1 | 5/2008 | Lasser |
| 2008/0109590 A1 | 5/2008 | Jung et al. |
| 2008/0115017 A1 | 5/2008 | Jacobson |
| 2008/0123420 A1 | 5/2008 | Brandman et al. |
| 2008/0123426 A1 | 5/2008 | Lutze et al. |
| 2008/0126686 A1* | 5/2008 | Sokolov et al. ............... 711/103 |
| 2008/0130341 A1 | 6/2008 | Shalvi et al. |
| 2008/0148115 A1 | 6/2008 | Sokolov et al. |
| 2008/0151618 A1 | 6/2008 | Sharon et al. |
| 2008/0151667 A1 | 6/2008 | Miu et al. |
| 2008/0158958 A1* | 7/2008 | Sokolov et al. .......... 365/185.08 |
| 2008/0181001 A1* | 7/2008 | Shalvi ...................... 365/185.03 |
| 2008/0189485 A1* | 8/2008 | Jung et al. ..................... 711/115 |
| 2008/0189720 A1* | 8/2008 | Moertl et al. ................. 719/314 |
| 2008/0198650 A1 | 8/2008 | Shalvi et al. |
| 2008/0198654 A1 | 8/2008 | Toda |
| 2008/0209116 A1 | 8/2008 | Caulkins |
| 2008/0209304 A1 | 8/2008 | Winarski et al. |
| 2008/0215798 A1 | 9/2008 | Sharon et al. |
| 2008/0219050 A1 | 9/2008 | Shalvi et al. |
| 2008/0239093 A1 | 10/2008 | Easwar et al. |
| 2008/0239812 A1 | 10/2008 | Abiko et al. |
| 2008/0253188 A1 | 10/2008 | Aritome |
| 2008/0263262 A1 | 10/2008 | Sokolov et al. |
| 2008/0263676 A1 | 10/2008 | Mo et al. |
| 2008/0270730 A1 | 10/2008 | Lasser et al. |
| 2008/0282106 A1 | 11/2008 | Shalvi et al. |
| 2008/0288714 A1 | 11/2008 | Salomon et al. |
| 2009/0013233 A1 | 1/2009 | Radke |
| 2009/0024905 A1 | 1/2009 | Shalvi et al. |
| 2009/0034337 A1 | 2/2009 | Aritome |
| 2009/0043831 A1 | 2/2009 | Antonopoulos et al. |
| 2009/0043951 A1 | 2/2009 | Shalvi et al. |
| 2009/0049234 A1 | 2/2009 | Oh et al. |
| 2009/0073762 A1 | 3/2009 | Lee et al. |
| 2009/0086542 A1 | 4/2009 | Lee et al. |
| 2009/0089484 A1 | 4/2009 | Chu |
| 2009/0091979 A1 | 4/2009 | Shalvi |
| 2009/0094930 A1 | 4/2009 | Schwoerer |
| 2009/0106485 A1 | 4/2009 | Anholt |
| 2009/0112949 A1 | 4/2009 | Ergan et al. |
| 2009/0132755 A1 | 5/2009 | Radke |
| 2009/0144600 A1 | 6/2009 | Perlmutter et al. |
| 2009/0150894 A1 | 6/2009 | Huang et al. |
| 2009/0157949 A1* | 6/2009 | Leibowitz ..................... 711/103 |
| 2009/0157950 A1 | 6/2009 | Selinger |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0172257 A1 | 7/2009 | Prins et al. |
| 2009/0172261 A1 | 7/2009 | Prins et al. |
| 2009/0193184 A1 | 7/2009 | Yu et al. |
| 2009/0199074 A1 | 8/2009 | Sommer et al. |
| 2009/0204824 A1 | 8/2009 | Lin et al. |
| 2009/0204872 A1 | 8/2009 | Yu et al. |
| 2009/0213653 A1 | 8/2009 | Perlmutter et al. |
| 2009/0213654 A1 | 8/2009 | Perlmutter et al. |
| 2009/0225595 A1 | 9/2009 | Kim |
| 2009/0228761 A1 | 9/2009 | Perlmutter et al. |
| 2009/0240872 A1 | 9/2009 | Perlmutter et al. |
| 2009/0248964 A1 | 10/2009 | Yano et al. |
| 2009/0265509 A1 | 10/2009 | Klein |
| 2009/0276545 A1* | 11/2009 | Lee et al. ........................... 710/8 |
| 2009/0300227 A1 | 12/2009 | Nochimowski et al. |
| 2009/0323412 A1 | 12/2009 | Mokhlesi et al. |
| 2009/0327608 A1 | 12/2009 | Eschmann |
| 2010/0017650 A1 | 1/2010 | Chin et al. |
| 2010/0034022 A1 | 2/2010 | Dutta et al. |
| 2010/0057976 A1 | 3/2010 | Lasser |
| 2010/0061151 A1 | 3/2010 | Miwa et al. |
| 2010/0082883 A1 | 4/2010 | Chen et al. |
| 2010/0083247 A1 | 4/2010 | Kanevsky et al. |
| 2010/0110580 A1 | 5/2010 | Takashima |
| 2010/0131697 A1 | 5/2010 | Alrod et al. |
| 2010/0142268 A1 | 6/2010 | Aritome |
| 2010/0142277 A1 | 6/2010 | Yang et al. |
| 2010/0169547 A1 | 7/2010 | Ou |
| 2010/0169743 A1 | 7/2010 | Vogan et al. |
| 2010/0174847 A1 | 7/2010 | Paley et al. |
| 2010/0211803 A1 | 8/2010 | Lablans |
| 2010/0287217 A1 | 11/2010 | Borchers et al. |
| 2010/0312947 A1* | 12/2010 | Luukkainen et al. ......... 711/103 |
| 2011/0010489 A1 | 1/2011 | Yeh |
| 2011/0060969 A1 | 3/2011 | Ramamoorthy et al. |
| 2011/0066793 A1 | 3/2011 | Burd |
| 2011/0075482 A1 | 3/2011 | Shepard et al. |
| 2011/0107049 A1 | 5/2011 | Kwon et al. |
| 2011/0149657 A1 | 6/2011 | Haratsch et al. |
| 2011/0199823 A1 | 8/2011 | Bar-Or et al. |
| 2011/0296088 A1* | 12/2011 | Duzly et al. .................. 711/103 |
| 2011/0302354 A1 | 12/2011 | Miller |

FOREIGN PATENT DOCUMENTS

| | | |
|---|---|---|
| EP | 1605509 A1 | 12/2005 |
| WO | 9610256 A1 | 4/1996 |
| WO | 9828745 A1 | 7/1998 |
| WO | 02100112 A1 | 12/2002 |
| WO | 03100791 A1 | 12/2003 |
| WO | 2007046084 A2 | 4/2007 |
| WO | 2007132452 A2 | 11/2007 |
| WO | 2007132453 A2 | 11/2007 |
| WO | 2007132456 A2 | 11/2007 |
| WO | 2007132457 A2 | 11/2007 |
| WO | 2007132458 A2 | 11/2007 |
| WO | 2007146010 A2 | 12/2007 |
| WO | 2008026203 A2 | 3/2008 |
| WO | 2008053472 A2 | 5/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009038961 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009063450 A2 | 5/2009 |
| WO | 2009072100 A2 | 6/2009 |
| WO | 2009072101 A2 | 6/2009 |
| WO | 2009072102 A2 | 6/2009 |
| WO | 2009072103 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |
| WO | 2009078006 A2 | 6/2009 |

(56) References Cited

FOREIGN PATENT DOCUMENTS

WO    2009095902 A2    8/2009
WO    2011024015 A1    3/2011

OTHER PUBLICATIONS

U.S. Appl. No. 12/332,368 Office Action dated Nov. 10, 2011.
U.S. Appl. No. 12/063,544 Office Action dated Dec. 14, 2011.
U.S. Appl. No. 12/186,867 Office Action dated Jan. 17, 2012.
U.S. Appl. No. 12/119,069 Office Action dated Nov. 14, 2011.
U.S. Appl. No. 12/037,487 Office Action dated Jan. 3, 2012.
U.S. Appl. No. 11/995,812 Office Action dated Oct. 28, 2011.
U.S. Appl. No. 12/551,567 Office Action dated Oct. 27, 2011.
U.S. Appl. No. 12/618,732 Office Action dated Nov. 4, 2011.
U.S. Appl. No. 12/649,382 Office Action dated Jan. 6, 2012.
U.S. Appl. No. 13/284,909, filed Oct. 30, 2011.
U.S. Appl. No. 13/284,913, filed Oct. 30, 2011.
U.S. Appl. No. 13/338,335, filed Dec. 28, 2011.
U.S. Appl. No. 13/355,536, filed Jan. 22, 2012.
Kim et al., "Multi-bit Error Tolerant Caches Using Two-Dimensional Error Coding", Proceedings of the 40th Annual ACM/IEEE International Symposium on Microarchitecture (MICRO-40), Chicago, USA, Dec. 1-5, 2007.
U.S. Appl. No. 11/995,814 Official Action dated Dec. 17, 2010.
U.S. Appl. No. 12/388,528 Official Action dated Nov. 29, 2010.
U.S. Appl. No. 12/251,471 Official Action dated Jan. 3, 2011.
Engineering Windows 7, "Support and Q&A for Solid-State Drives", e7blog, May 5, 2009.
Micron Technology Inc., "Memory Management in NAND Flash Arrays", Technical Note, year 2005.
Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.
Park et al., "Sub-Grouped Superblock Management for High-Performance Flash Storages", IEICE Electronics Express, vol. 6, No. 6, pp. 297-303, Mar. 25, 2009.
"How to Resolve "Bad Super Block: Magic Number Wrong" in BSD", Free Online Articles Director Article Base, posted Sep. 5, 2009.
Ubuntu Forums, "Memory Stick Failed IO Superblock", posted Nov. 11, 2009.
Super User Forums, "SD Card Failure, can't read superblock", posted Aug. 8, 2010.
U.S. Appl. No. 12/987,174, filed Jan. 10, 2011.
U.S. Appl. No. 12/987,175, filed Jan. 10, 2011.
U.S. Appl. No. 12/963,649, filed Dec. 9, 2010.
U.S. Appl. No. 13/021,754, filed Feb. 6, 2011.
U.S. Appl. No. 12/323,544 Official Action dated Mar. 9, 2012.
Chinese Patent Application # 200780026181.3 Official Action dated Mar. 7, 2012.
Chinese Patent Application # 200780026094.8 Official Action dated Feb. 2, 2012.
U.S. Appl. No. 12/332,370 Official Action dated Mar. 8, 2012.
U.S. Appl. No. 12/579,432 Official Action dated Feb. 29, 2012.
U.S. Appl. No. 12/522,175 Official Action dated Mar. 27, 2012.
U.S. Appl. No. 12/607,085 Official Action dated Mar. 28, 2012.
Budilovsky et al., "Prototyping a High-Performance Low-Cost Solid-State Disk", SYSTOR—The 4th Annual International Systems and Storage Conference, Haifa, Israel, May 30-Jun. 1, 2011.
NVM Express Protocol, "NVM Express", Revision 1.0b, Jul. 12, 2011.
SCSI Protocol, "Information Technology—SCSI Architecture Model—5 (SAM-5)", INCITS document T10/2104-D, revision 01, Jan. 28, 2009.
SAS Protocol, "Information Technology—Serial Attached SCSI—2 (SAS-2)", INCITS document T10/1760-D, revision 15a, Feb. 22, 2009.
Ankolekar et al., "Multibit Error-Correction Methods for Latency-Constrained Flash Memory Systems", IEEE Transactions on Device and Materials Reliability, vol. 10, No. 1, pp. 33-39, Mar. 2010.
U.S. Appl. No. 12/344,233 Official Action dated Jun. 24, 2011.
U.S. Appl. No. 11/995,813 Official Action dated Jun. 16, 2011.
Berman et al., "Mitigating Inter-Cell Coupling Effects in MLC NAND Flash via Constrained Coding", Flash Memory Summit, Santa Clara, USA, Aug. 19, 2010.
U.S. Appl. No. 12/178,318 Official Action dated May 31, 2011.
CN Patent Application # 200780026181.3 Official Action dated Apr. 8, 2011.
U.S. Appl. No. 12/534,898 Official Action dated Mar. 23, 2011.
U.S. Appl. No. 13/047,822, filed Mar. 15, 2011.
U.S. Appl. No. 13/069,406, filed Mar. 23, 2011.
U.S. Appl. No. 13/088,361, filed Apr. 17, 2011.
Agrell et al., "Closest Point Search in Lattices", IEEE Transactions on Information Theory, vol. 48, No. 8, pp. 2201-2214, Aug. 2002.
Bez et al., "Introduction to Flash memory", Proceedings of the IEEE, vol. 91, No. 4, pp. 489-502, Apr. 2003.
Blahut, R. E., "Theory and Practice of Error Control Codes," Addison-Wesley, May, 1984, section 3.2, pp. 47-48.
Chang, L., "Hybrid Solid State Disks: Combining Heterogeneous NAND Flash in Large SSDs", ASPDAC, Jan. 2008.
Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.
Databahn™, "Flash memory controller IP", Denali Software, Inc., 1994 https://www.denali.com/en/products/databahn_flash.jsp.
Datalight, Inc., "FlashFX Pro 3.1 High Performance Flash Manager for Rapid Development of Reliable Products", Nov. 16, 2006.
Duann, N., Silicon Motion Presentation "SLC & MLC Hybrid", Flash Memory Summit, Santa Clara, USA, Aug. 2008.
Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.
Eitan et al., "Multilevel Flash Cells and their Trade-Offs", Proceedings of the 1996 IEEE International Electron Devices Meeting (IEDM), pp. 169-172, New York, USA 1996.
Engh et al., "A self adaptive programming method with 5 mV accuracy for multi-level storage in FLASH", pp. 115-118, Proceedings of the IEEE 2002 Custom Integrated Circuits Conference, May 12-15, 2002.
Goodman et al., "On-Chip ECC for Multi-Level Random Access Memories," Proceedings of the IEEE/CAM Information Theory Workshop, Ithaca, USA, Jun. 25-29, 1989.
Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.
Han et al., "CATA: A Garbage Collection Scheme for Flash Memory File Systems", Ubiquitous Intelligence and Computing, vol. 4159/2006, pp. 103-112, Springer Berlin / Heidelberg, Aug. 25, 2006.
Horstein, "On the Design of Signals for Sequential and Nonsequential Detection Systems with Feedback," IEEE Transactions on Information Theory IT-12:4 (Oct. 1966), pp. 448-455.
Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.
Kawaguchi et al. 1995. A flash-memory based file system. In Proceedings of the USENIX 1995 Technical Conference, New Orleans, Louisiana. 155-164.
Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.
Lee et al., "Effects of Floating Gate Interference on NAND Flash Memory Cell Operation", IEEE Electron Device Letters, vol. 23, No. 5, pp. 264-266, May 2002.

(56) References Cited

OTHER PUBLICATIONS

Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.
Mielke et al., "Recovery Effects in the Distributed Cycling of Flash Memories", IEEE 44th Annual International Reliability Physics Symposium, pp. 29-35, San Jose, USA, Mar. 2006.
Onfi, "Open NAND Flash Interface Specification," revision 1.0, Dec. 28, 2006.
Phison Electronics Corporation, "PS8000 Controller Specification (for SD Card)", revision 1.2, Document No. S-07018, Mar. 28, 2007.
Shalvi, et al., "Signal Codes," Proceedings of the 2003 IEEE Information Theory Workshop (ITW'2003), Paris, France, Mar. 31-Apr. 4, 2003.
Shiozaki, A., "Adaptive Type-II Hybrid Broadcast ARQ System", IEEE Transactions on Communications, vol. 44, Issue 4, pp. 420-422, Apr. 1996.
Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.
ST Microelectronics, "Bad Block Management in NAND Flash Memories", Application note AN-1819, Geneva, Switzerland, May 2004.
ST Microelectronics, "Wear Leveling in Single Level Cell NAND Flash Memories," Application note AN-1822 Geneva, Switzerland, Feb. 2007.
Takeuchi et al., "A Double Level $V_{TH}$ Select Gate Array Architecture for Multi-Level NAND Flash Memories", Digest of Technical Papers, 1995 Symposium on VLSI Circuits, pp. 69-70, Jun. 8-10, 1995.
Takeuchi et al., "A Multipage Cell Architecture for High-Speed Programming Multilevel NAND Flash Memories", IEEE Journal of Solid State Circuits, vol. 33, No. 8, Aug. 1998.
Wu et al., "eNVy: A non-Volatile, Main Memory Storage System", Proceedings of the 6th International Conference on Architectural support for programming languages and operating systems, pp. 86-87, San Jose, USA, 1994.
International Application PCT/IL2007/000575 Patentability report dated Mar. 26, 2009.
International Application PCT/IL2007/000575 Search Report dated May 30, 2008.
International Application PCT/IL2007/000576 Patentability Report dated Mar. 19, 2009.
International Application PCT/IL2007/000576 Search Report dated Jul. 7, 2008.
International Application PCT/IL2007/000579 Patentability report dated Mar. 10, 2009.
International Application PCT/IL2007/000579 Search report dated Jul. 3, 2008.
International Application PCT/IL2007/000580 Patentability Report dated Mar. 10, 2009.
International Application PCT/IL2007/000580 Search Report dated Sep. 11, 2008.
International Application PCT/IL2007/000581 Patentability Report dated Mar. 26, 2009.
International Application PCT/IL2007/000581 Search Report dated Aug. 25, 2008.
International Application PCT/IL2007/001059 Patentability report dated Apr. 19, 2009.
International Application PCT/IL2007/001059 Search report dated Aug. 7, 2008.
International Application PCT/IL2007/001315 search report dated Aug. 7, 2008.
International Application PCT/IL2007/001315 Patentability Report dated May 5, 2009.
International Application PCT/IL2007/001316 Search report dated Jul. 22, 2008.
International Application PCT/IL2007/001316 Patentability Report dated May 5, 2009.
International Application PCT/IL2007/001488 Search report dated Jun. 20, 2008.
International Application PCT/IL2008/000329 Search report dated Nov. 25, 2008.
International Application PCT/IL2008/000519 Search report dated Nov. 20, 2008.
International Application PCT/IL2008/001188 Search Report dated Jan. 28, 2009.
International Application PCT/IL2008/001356 Search Report dated Feb. 3, 2009.
International Application PCT/IL2008/001446 Search report dated Feb. 20, 2009.
U.S. Appl. No. 11/949,135 Official Action dated Oct. 2, 2009.
U.S. Appl. No. 12/019,011 Official Action dated Nov. 20, 2009.
Sommer, N., U.S. Appl. No. 12/171,797 "Memory Device with Non-Uniform Programming Levels" filed Jul. 11, 2008.
Shalvi et al., U.S. Appl. No. 12/251,471 "Compensation for Voltage Drifts in Analog Memory Cells" filed Oct. 15, 2008.
Sommer et al., U.S. Appl. No. 12/497,707 "Data Storage in Analog Memory Cells with Protection Against Programming Interruption" filed Jul. 6, 2009.
Winter et al., U.S. Appl. No. 12/534,893 "Improved Data Storage in Analog Memory Cells Using Modified Pass Voltages" filed Aug. 4, 2009.
Winter et al., U.S. Appl. No. 12/534,898 "Data Storage Using Modified Voltages" filed Aug. 4, 2009.
Shalvi et al., U.S. Appl. No. 12/551,583 "Segmented Data Storage" filed Sep. 1, 2009.
Shalvi et al., U.S. Appl. No. 12/551,567 "Reliable Data Storage in Analog Memory Cells Subjected to Long Retention Periods" filed Sep. 1, 2009.
Perlmutter et al., U.S. Appl. No. 12/558,528 "Estimation of Memory Cell Read Thresholds by Sampling Inside Programming Level Distribution Intervals" filed Sep. 13, 2009.
Sokolov, D., U.S. Appl. No. 12/579,430 "Efficient Programming of Analog Memory Cell Devices" filed Oct. 15, 2009.
Shalvi, O., U.S. Appl. No. 12/579,432 "Efficient Data Storage in Storage Device Arrays" filed Oct. 15, 2009.
Sommer et al., U.S. Appl. No. 12/607,078 "Data Scrambling in Memory Devices" filed Oct. 28, 2009.
Sommer et al., U.S. Appl. No. 12/607,085 "Data Scrambling Schemes for Memory Devices" filed Oct. 28, 2009.
Shalvi et al., U.S. Appl. No. 12/618,732 "Storage at M Bits/Cell Density in N Bits/Cell Analog Memory Cell Devices, M>N" filed Nov. 15, 2009.
Sommer et al., U.S. Appl. No. 12/649,358 "Efficient Readout Schemes for Analog Memory Cell Devices" filed Dec. 30, 2009.
Sommer et al., U.S. Appl. No. 12/649,360 "Efficient Readout Schemes for Analog Memory Cell Devices Using Multiple Read Threshold Sets" filed Dec. 30, 2009.
Rotbard et al., U.S. Appl. No. 12/649,382 "Rejuvenation of Analog Memory Cells" filed Dec. 30, 2009.
Shachar et al., U.S. Appl. No. 12/688,883 "Hierarchical data storage system" filed Jan. 17, 2010.
Jedec Standard JESD84-C44, "Embedded MultiMediaCard (e•MMC) Mechanical Standard, with Optional Reset Signal", Jedec Solid State Technology Association, USA, Jul. 2009.
Jedec, "UFS Specification", version 0.1, Nov. 11, 2009.
Compaq et al., "Universal Serial Bus Specification", revision 2.0, Apr. 27, 2000.
SD Group & SD Card Association, "SD Specifications Part 1 Physical Layer Specification", version 3.01, draft 1.00, Nov. 9, 2009.
Serial ATA International Organization, "Serial ATA Revision 3.0 Specification", Jun. 2, 2009.
Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.
Shalvi, O., U.S. Appl. No. 12/758,044 "Memory device with negative thresholds" filed Apr. 12, 2010.
Sokolov et al., U.S. Appl. No. 12/714,501 "Selective Activation of Programming Schemes in Analog Memory Cell Arrays" filed Feb. 28, 2010.

(56) References Cited

OTHER PUBLICATIONS

Sokolov et al., U.S. Appl. No. 12/728,287 "Use of host system resources by memory controller" filed Mar. 22, 2010.
Sommer et al., U.S. Appl. No. 12/728,296 "Database of Memory Read Thresholds" filed Mar. 22, 2010.
Sommer et al., U.S. Appl. No. 12/758,003 "Selective re-programming of analog memory cells" filed Apr. 11, 2010.
Huffman, A., "Non-Volatile Memory Host Controller Interface (NVMHCI)", Specification 1.0, Apr. 14, 2008.
Panchbhai et al., "Improving Reliability of NAND Based Flash Memory Using Hybrid SLC/MLC Device", Project Proposal for CSci 8980—Advanced Storage Systems, University of Minnesota, USA, Spring 2009.
U.S. Appl. No. 11/957,970 Official Action dated May 20, 2010.
Shalvi et al., U.S. Appl. No. 12/822,207 "Adaptive Over-Provisioning in Memory Systems" filed Jun. 24, 2010.
Wei, L., "Trellis-Coded Modulation With Multidimensional Constellations", IEEE Transactions on Information Theory, vol. IT-33, No. 4, pp. 483-501, Jul. 1987.
U.S. Appl. No. 13/114,049 Official Action dated Sep. 12, 2011.
U.S. Appl. No. 12/405,275 Official Action dated Jul. 29, 2011.
Conway et al., "Sphere Packings, Lattices and Groups", 3rd edition, chapter 4, pp. 94-135, Springer, New York, USA 1998.
Chinese Patent Application # 200780040493.X Official Action dated Jun. 15, 2011.
U.S. Appl. No. 12/037,487 Official Action dated Oct. 3, 2011.
U.S. Appl. No. 12/649,360 Official Action dated Aug. 9, 2011.
U.S. Appl. No. 13/192,504 filed Jul. 28, 2011.
U.S. Appl. No. 13/192,852 filed Aug. 2, 2011.
U.S. Appl. No. 13/231,963 filed Sep. 14, 2011.
U.S. Appl. No. 13/239,408, filed Sep. 22, 2011.
U.S. Appl. No. 13/239,411 filed Sep. 22, 2011.
U.S. Appl. No. 13/214,257 filed Aug. 22, 2011.
U.S. Appl. No. 13/192,501 filed Jul. 28, 2011.
U.S. Appl. No. 13/192,495 filed Jul. 28, 2011.
U.S. Appl. No. 12/880,101 "Reuse of Host Hibernation Storage Space by Memory Controller", filed Sep. 12, 2010.
U.S. Appl. No. 12/890,724 "Error Correction Coding Over Multiple Memory Pages", filed Sep. 27, 2010.
U.S. Appl. No. 12/171,797 Official Action dated Aug. 25, 2010.
U.S. Appl. No. 12/497,707 Official Action dated Sep. 15, 2010.
U.S. Appl. No. 11/995,801 Official Action dated Oct. 15, 2010.
Numonyx, "M25PE16: 16-Mbit, page-erasable serial flash memory with byte-alterability, 75 MHz SPI bus, standard pinout", Apr. 2008.
Hong et al., "NAND Flash-based Disk Cache Using SLC/MLC Combined Flash Memory", 2010 International Workshop on Storage Network Architecture and Parallel I/Os, pp. 21-30, USA, May 3, 2010.
U.S. Appl. No. 11/945,575 Official Action dated Aug. 24, 2010.
U.S. Appl. No. 12/045,520 Official Action dated Nov. 16, 2010.
US 7,161,836, 1/2007, Wan et al. (withdrawn).
International Search Report and Written Opinion from PCT/2013/056069, mailed Nov. 29, 2013, Apple Inc., pp. 1-9.

\* cited by examiner

USE OF HOST SYSTEM RESOURCES BY MEMORY CONTROLLER

CROSS-REFERENCE TO RELATED APPLICATIONS

This application claims the benefit of U.S. Provisional Patent Application 61/163,133, filed Mar. 25, 2009, whose disclosure is incorporated herein by reference.

FIELD OF THE INVENTION

The present invention relates generally to data storage, and particularly to memory controllers that use host system resources.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. This analog value represents the information stored in the cell. In Flash memories, for example, each analog memory cell holds a certain amount of electrical charge. The range of possible analog values is typically divided into intervals, each interval corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume two possible programming levels. Higher-density devices, often referred to as Multi-Level Cell (MLC) devices, store two or more bits per memory cell, i.e., can be programmed to assume more than two possible programming levels.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24th International Conference on Microelectronics (MIEL), Nis, Serbia and Montenegro, May 16-19, 2004, volume 1, pages 377-384, which is incorporated herein by reference.

SUMMARY OF THE INVENTION

An embodiment of the present invention provides a method for data storage, including:

in a system that includes a host having a host memory and a memory controller that is separate from the host and stores data for the host in a non-volatile memory including multiple analog memory cells, storing in the host memory information items relating to respective groups of the analog memory cells of the non-volatile memory;

receiving from the host a command that causes the memory controller to access a given group of the analog memory cells; and in response to the command, retrieving from the host memory by the memory controller a respective information item relating to the given group of the analog memory cells, and accessing the given group of the analog memory cells using the retrieved information item.

In some embodiments, the host memory includes a Random Access Memory (RAM). In an embodiment, the information items includes read thresholds, and accessing the given group includes reading the memory cells in the group using one or more read thresholds retrieved from the host memory. In a disclosed embodiment, the information items include erase thresholds, and accessing the given group includes erasing the memory cells in the given group using one or more erase thresholds retrieved from the host memory. In another embodiment, the analog memory cells are programmed using a programming process, the information items include parameters of the programming process, and accessing the given group includes programming the given group using one or more of the parameters that are retrieved from the host memory. In an embodiment, the programming process includes an iterative Programming and Verification (P&V) process.

In yet another embodiment, the information items are indicative of wear levels of the respective groups of the analog memory cells. In still another embodiment, the information items are indicative of distortion levels in the respective groups of the analog memory cells. In an embodiment, the information items specify at least one attribute selected from a set of attributes consisting of a number of programming states, an Error Correction Code (ECC) and an ECC block size to be used in programming the respective groups of the analog memory cells. In an embodiment, the information items specify a relation between logical addresses and physical storage locations of the respective groups of the analog memory cells. In another embodiment, the information items are indicative of data stored in memory cells that neighbor the respective groups of the analog memory cells.

In some embodiments, receiving the command includes communicating between the memory controller and the host over a first physical interface, and retrieving the information item includes communicating between the memory controller and the host memory over a second physical interface, separate from the first physical interface. In an embodiment, retrieving the information item includes fetching the information item by the memory controller without execution of any operations by the host relating to retrieval of the information item. In another embodiment, reception of the command and retrieval of the information item are performed over a common physical interface that connects the memory controller and the host. In some embodiments, the common physical interface may conform to one of a NAND interface specification, a Micro-SD (μSD) interface specification, an Embedded Multi-Media Card (eMMC) interface specification, a Universal Flash Storage (UFS) interface specification, a Serial Advanced Technology Attachment (SATA) interface specification, a Universal Serial Bus (USB) interface specification and a Peripheral Component Interconnect (PCI) interface.

In a disclosed embodiment, storing the information items and retrieving the information item include:

using a hardware signal, sending a request from the memory controller to the host to exchange one or more information items with the memory controller; and responsively to the request, initiating exchange of the one or more information items by the host.

In an embodiment, storing the information items includes sending the information items in responses sent from the memory controller to the host, and retrieving the information item includes sending the information item in a host command sent from the host to the memory controller.

There is additionally provided, in accordance with an embodiment of the present invention, a method for data storage, including:

in a system that includes a host and a memory controller that is separate from the host and stores data for the host in a non-volatile memory, assigning a resource of the host for use by the memory controller;

receiving from the host a command that causes the memory controller to access the non-volatile memory; and in response to the command, accessing the non-volatile memory using the assigned resource of the host.

In some embodiments, assigning the resource includes assigning logic circuitry in the host, and accessing the non-volatile memory includes applying the logic circuitry to process data that is accessed by the command. In another embodiment, assigning the resource includes providing supply voltage to the memory controller by the host. In yet another embodiment, accessing the non-volatile memory includes reading data from the non-volatile memory, and invoking the host to cancel interference in the read data. Accessing the non-volatile memory may include reading from the non-volatile memory data that is encoded with an Error Correction Code (ECC), and invoking the host to decode the ECC. In an embodiment, invoking the host includes making an attempt to decode the ECC using a first decoder in the memory controller, and, responsively to a failure of the attempt, invoking a second decoder in the host to decode the ECC. In another embodiment, assigning the resource includes assigning memory space in the host, and accessing the non-volatile memory includes caching multiple pages in the memory space assigned in the host, and copying the multiple cached pages sequentially to the non-volatile memory.

There is also provided, in accordance with an embodiment of the present invention, a data storage apparatus, including:

a first interface, which is configured to communicate with a non-volatile memory that includes multiple analog memory cells;

a second interface, which is configured to communicate with a host having a host memory; and a processor, which is configured to store in the host memory information items relating to respective groups of the analog memory cells of the non-volatile memory, to receive from the host a command that causes the processor to access a given group of the analog memory cells, and, in response to the command, to retrieve from the host memory a respective information item relating to the given group of the analog memory cells and to access the given group of the analog memory cells using the retrieved information item.

There is further provided, in accordance with an embodiment of the present invention, a data storage apparatus, including:

a first interface, which is configured to communicate with a non-volatile memory;

a second interface, which is configured to communicate with a host; and a processor, which is configured to receive from the host a command for accessing the non-volatile memory, and to access the non-volatile memory in response to the command using a pre-assigned resource of the host.

There is additionally provided, in accordance with an embodiment of the present invention, a data storage apparatus, including:

a non-volatile memory including multiple analog memory cells; and a processor, which is configured to communicate with a host having a host memory, to store in the host memory information items relating to respective groups of the analog memory cells of the non-volatile memory, to receive from the host a command that causes the processor to access a given group of the analog memory cells, and, in response to the command, to retrieve from the host memory a respective information item relating to the given group of the analog memory cells and to access the given group of the analog memory cells using the retrieved information item.

The present invention will be more fully understood from the following detailed description of the embodiments thereof, taken together with the drawings in which:

DETAILED DESCRIPTION OF EMBODIMENTS

Overview

In some data storage applications, a memory controller is connected to a host system and stores data for the host system in a non-volatile memory. For example, a mobile phone or media player may store data in a Micro-Secure Digital (μSD) card, Embedded Multi-Media Card (eMMC) or Universal Flash Storage (UFS) device. In many cases, the host system has more hardware resources (e.g., memory space and computational power) than the internal resources of the memory controller. Embodiments of the present invention that are described hereinbelow provide improved methods and systems for data storage. In these methods and systems, the memory controller uses hardware resources of the host system in order to access the non-volatile memory.

In some embodiments, a memory controller stores data for a host in a non-volatile memory comprising multiple analog memory cells. The host has a host memory, e.g., a Dynamic Random Access Memory (DRAM). The host memory holds information items relating to respective groups of the analog memory cells, e.g., information items relating to erasure blocks, word lines or pages of the non-volatile memory. The memory controller receives a command from the host, which causes the memory controller to access a given group of the analog memory cells. In response to this command, the memory controller retrieves from the host memory an information item that corresponds to the given group of analog memory cells, and accesses the memory cells in the given group using the retrieved information item.

Various examples of information items that can be stored in the host memory, such as storage parameters and configurations for respective groups of memory cells, and/or logical-to-physical address translation tables, are described herein. In some embodiments, data for storage is accumulated in the host memory, and then copied sequentially to the non-volatile memory. Several examples of interfaces between the memory controller and the host memory, either directly or via the host, are also described.

The methods and systems described herein increase the performance of memory controllers, e.g., programming and readout speed, by enabling them to exploit the hardware resources of the host system when performing memory access operations. Since the internal hardware resources of memory controllers can be reduced when using the disclosed techniques, memory controller cost, size and power consumption can be reduced, as well.

System Description

Figure 1:
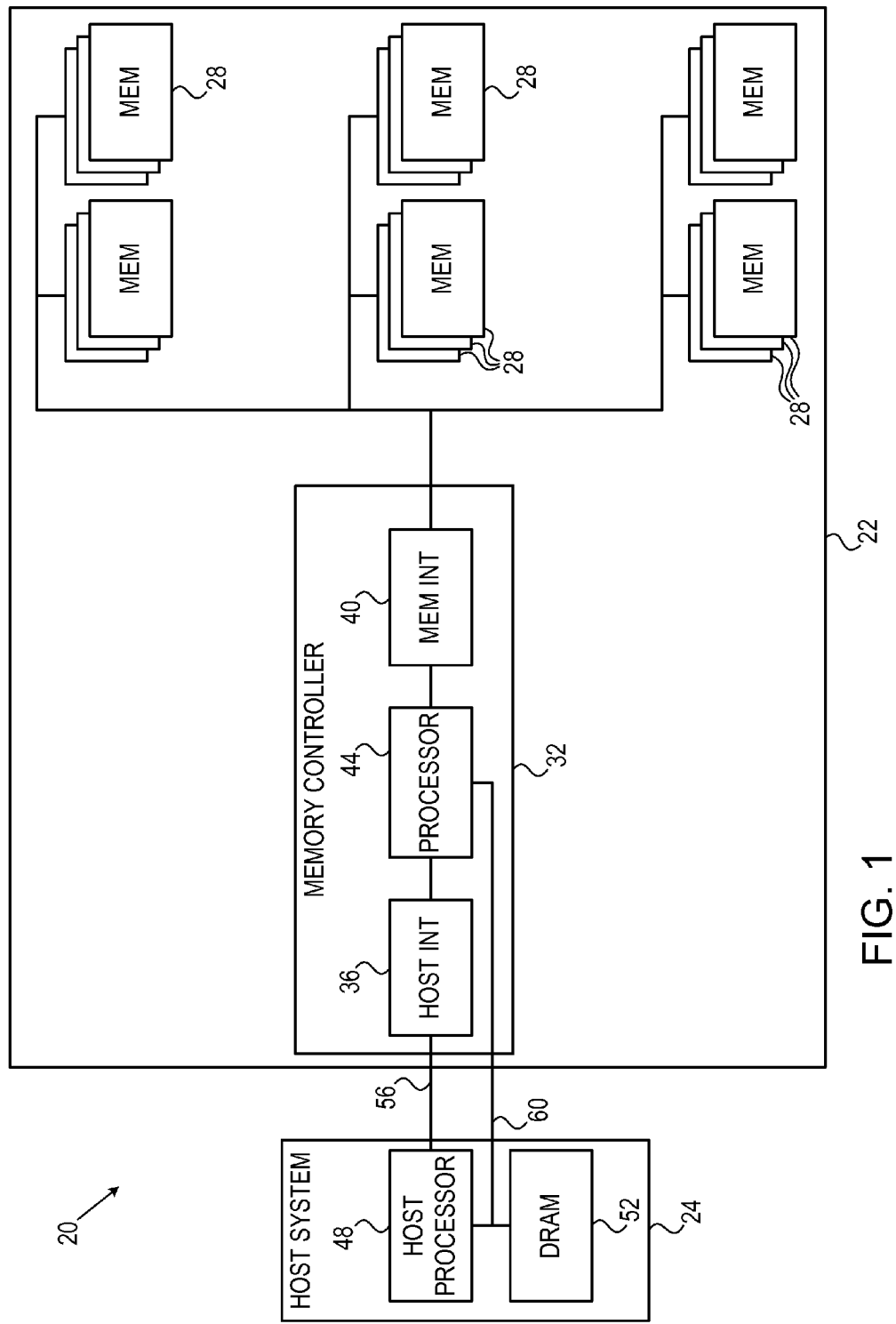
FIG. 1 is a block diagram that schematically illustrates a data storage system, in accordance with an embodiment of the present invention.

FIG. 1 is a block diagram that schematically illustrates a data storage system 20, in accordance with an embodiment of the present invention. System 20 comprises a memory system 22 and a host system 24. Memory system 22 accepts data for storage from host system 24 and stores it in memory, and retrieves data from memory and provides it to the host system. In the present example, system 22 comprises a Micro-Secure Digital (µSD) card Solid-State Disk (SSD) that stores data for a cellular phone, media player, digital camera or other host. In alternative embodiments, however, system 22 may be used in any other suitable application and with any other suitable host system, such as in computing devices such as mobile computers, WiFi terminals or other communication terminals, Global Positioning System (GPS) units, removable memory modules such as Disk-On-Key (DOK) devices, Secure Digital (SD) cards, Multi-Media Cards (MMC) and embedded MMC (eMMC), digital cameras, music and other media players such as Portable Media Players (PMP), and/or any other system or device in which data is stored and retrieved.

Memory system 22 comprises multiple memory devices 28, each comprising multiple analog memory cells. In the present example, devices 28 comprise non-volatile NAND Flash devices, although any other suitable memory type, such as NOR and Charge Trap Flash (CTF) Flash cells, phase change RAM (PRAM, also referred to as Phase Change Memory—PCM), Nitride Read Only Memory (NROM), Ferroelectric RAM (FRAM) and/or magnetic RAM (MRAM) can also be used.

In the context of the present patent application and in the claims, the term "analog memory cell" is used to describe any memory cell that holds a continuous, analog value of a physical parameter, such as an electrical voltage or charge. Any suitable type of analog memory cells, such as the types listed above, can be used. In the present example, each memory device 28 comprises a non-volatile memory of NAND Flash cells. The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 22 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell. The memory cells are typically arranged in rows and columns. Typically, a given memory device comprises multiple erasure blocks (also referred to as memory blocks), i.e., groups of memory cells that are erased together.

Each memory device 28 may comprise a packaged device or an unpackaged semiconductor chip or die. Generally, memory system 22 may comprise any suitable number of memory devices of any desired type and size. Although the system configuration of FIG. 1 comprises multiple memory devices, some of the methods and systems described herein can also be used in systems having only a single memory device.

Memory system 22 comprises a memory controller 32, which accepts data from host system 24 and stores it in memory devices 28, and retrieves data from the memory devices and provides it to the host system. Memory controller 32 comprises a host interface 36 for communicating with host system 24, a memory interface 40 for communicating with memory devices 28, and a processor that processes the stored and retrieved data. For example, processor 44 may encode the data for storage with an Error Correction Code (ECC) and decode the ECC of data read from memory. The functions of processor 44 can be implemented, for example, using software running on a suitable Central Processing Unit (CPU), using hardware (e.g., state machine or other logic), or using a combination of software and hardware elements.

In some embodiments, memory controller 32 uses hardware resources of host system 24 for performing memory access operations (e.g., read or write operations) that access memory devices 28. In the embodiment of FIG. 1, host system 24 comprises a host processor 48 and a host memory, in the present example comprising a Dynamic Random Access Memory (DRAM) 52. DRAM 52 may be used by host processor 48 for storing data, for storing program instructions or for any other purpose. In some embodiments, some of the storage space in DRAM 52 is used for storing information used by memory controller 32. In the example of FIG. 1, memory controller 32 communicates with host processor 48 (via host interface 36) using a host bus 56. In addition, processor 44 of memory controller 32 communicates directly with DRAM 52 using a dedicated interface 60. In alternative embodiments, memory controller 32 communicates with host processor 48 and with DRAM 52 using host bus 56, in which case interface 60 is omitted.

Memory controller 32, and in particular processor 44, may be implemented in hardware. Alternatively, the memory controller may comprise a microprocessor that runs suitable software, or a combination of hardware and software elements. In some embodiments, processor 44 comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

The system configuration of FIG. 1 is an example configuration, which is shown purely for the sake of conceptual clarity. Any other suitable memory system configuration can also be used. For example, in some embodiments two or more memory controllers 32 may be connected to the same host processor. Although the embodiments described herein refer to DRAM, host system may comprise any other suitable type of volatile and/or non-volatile host memory. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory devices 28 and memory controller 32 are implemented as separate Integrated Circuits (ICs). In alternative embodiments, however, the memory devices and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which one or more of the memory devices are disposed. Further alternatively, some or all of the functionality of memory controller 32 can be implemented in software and carried out by host processor 48 or other element of host system 24, or by any other type of memory controller. In some embodiments, host processor 48 and Memory controller 32 may be fabricated on the same die, or on separate dies in the same device package.

Data Storage in Non-Volatile Memory Using Host System Resources

In many practical applications, host system 24 has considerably more hardware resources than those available internally in memory controller 32. In some mobile phones, for example, memory controller 32 comprises a SD or eMMC controller having limited memory resources and limited computational power. The host system, on the other hand, often comprises a powerful processor and considerable DRAM storage space. In some embodiments of the present invention, memory controller 32 uses the richer hardware resources of host system 24 for accessing memory devices 28. In the example of FIG. 1 the hardware resource comprises host memory (DRAM) storage space, although various other hardware resources of the host system can also be used.

In some embodiments, storage space is assigned in DRAM 52 for storing information items that are used by memory controller 32 in accessing memory devices 28. In addition, the memory controller supports one or more operations that access memory devices 28 using the information items stored in the DRAM. The information items may comprise, for example, storage parameters and configurations, logical-to-physical address translation tables or any other information that is useful for the memory controller in accessing (e.g., reading, writing or erasing) the memory devices. When executing a given operation of this sort, usually in response to a host command, the memory controller retrieves the appropriate information from DRAM 52 and then accesses memory devices 28 using the retrieved information.

In some embodiments, the information items stored in DRAM 52 comprise storage parameters for respective groups of memory cells. Information items may be stored per memory device, per memory die, per erasure block, per word line or page, or per any other suitable group of memory cells.

When preparing to access (e.g., read, write or erase) a given group of memory cells in devices 28, the memory controller retrieves the storage parameters of this memory cell group from DRAM 52, and then accesses the memory cells in the group using the retrieved storage parameters. Since the available storage space in DRAM 52 is often considerably larger than the internal storage space in processor 44, this technique enables the memory controller to better match the storage parameters to the actual group of memory cells being accessed. Any suitable storage parameters can be used.

For example, memory devices 28 may comprise analog memory cells (e.g., Flash cells) that are read by comparing their storage values to certain read thresholds. In these embodiments, memory controller 32 may store read threshold values for different groups of memory cells (e.g., for different erasure blocks) in DRAM 52. The memory controller supports a read operation, which reads data from a certain group of memory cells in devices 28 by retrieving the read threshold values applicable to this group from DRAM 52, and then reading the data from the group using the retrieved read thresholds.

As another example, the memory cells in memory devices 28 may be programmed using an iterative Programming and Verification (P&V) process. In a typical P&V process, an entire memory page is written by applying a sequence of programming pulses to a group of memory cells that are mapped to this page. The level of the programming pulses increases incrementally from pulse to pulse. The storage values programmed in the cells are read ("verified") after each pulse, and the iterations continue until the desired levels are reached. In some embodiments, parameters of the P&V process that are applicable to different groups of memory cells are stored in DRAM 52 of host system 24. The memory controller supports a write operation, which stores data in a certain group of memory cells by retrieving the corresponding P&V parameters from DRAM 52, and then programming the group of memory cells using the retrieved P&V parameters.

P&V parameters that may be stored in DRAM 52 may comprise, for example, verification thresholds that are used for verifying the storage values written into the memory cells, incremental step sizes (i.e., the increment between successive programming pulses, also referred to as Incremental Step Pulse Programming—ISPP), initial programming pulse magnitudes, and/or any other suitable parameter.

As yet another example, the memory cells in devices 28 may be erased and then verified against certain erase verification thresholds. In some embodiments, the memory controller stores different erase verification threshold values for different memory cell groups in DRAM 52. The memory controller may support an erase operation, which retrieves the erase verification threshold values of this cell group from DRAM 52 and erases the cell group using the retrieved thresholds.

Other examples of information items that can be stored in DRAM 52 are indicative of the wear level or health level of respective groups of memory cells in devices 28, or other historic figures-of-merit of the memory cells. Such information items may comprise, for example, the number of Programming and Erasure (P/E) cycles that each group of memory cells has gone through, or the time that elapsed since the last programming of each group of memory cells.

Other information items may be indicative of the level of distortion present in each group of memory cells in devices 28. Such parameters may comprise, for example, an estimate of cross-coupling interference, an estimated drift of the cells' storage values, or an estimated temperature-time integral (the operating temperature integrated over time) for different groups of memory cells. Yet another example of an information item that can be stored in DRAM 52 comprises the index of the last page that was stored in each erasure block. All of these information items may be useful in determining the way the memory cells are read and/or programmed. Example techniques of this sort are described, for example, in PCT International Publications WO 2007/132453, WO 2007/132457, WO 2008/026203, WO 2008/053472 and WO 2008/111058, whose disclosures are incorporated herein by reference.

In some embodiments, memory controller 32 stores data in different groups of memory cells in devices 28 using different storage configurations. For example, the memory controller may modify the number of programming states (programming levels) and/or the Error Correction Code (ECC) from one memory cell group to another. Example techniques of this sort are described, for example, in PCT International Publication WO 2007/132456, whose disclosure is incorporated herein by reference. As another example, the memory controller may use different ECC block sizes, e.g., in order to provide different trade-offs between error correction capability and latency. In an example embodiment, the memory controller may encode some pages using 2 KB blocks, and other pages using 4 KB blocks.

In some embodiments, memory controller 32 stores in DRAM 52 the storage configurations to be applied in different memory cells groups of devices 28 (e.g., the number of programming levels, the type of ECC and/or the ECC block size to be used in each erasure block, word line or page). The memory controller supports read and write operations that retrieve the storage configuration for a given memory cell group from DRAM 52, and then read or program the cell group using the retrieved storage configuration.

In some embodiments, the memory controller receives from host system 24 read/write commands that are specified using logical addresses (also referred to as virtual addresses). The memory controller translates the logical addresses into physical storage locations in memory devices 28, and reads or writes the data to or from the appropriate physical storage locations. Translation between logical addresses and physical storage locations is typically performed by querying translation tables that are managed by the memory controller.

In some embodiments, memory controller 32 stores the mapping between logical addresses and physical storage locations in DRAM 52. The logical-physical mapping may be represented by one or more tables, or using any other suitable data structure. The mapping may map logical addresses to physical storage locations, physical storage locations to logical addresses, or both. In these embodiments, the memory controller supports read and write operations that translate between logical addresses and physical storage locations by querying the mapping stored in DRAM 52.

For example, in response to a read command from the host system that requests readout from a given range of logical addresses, the memory controller may execute a read operation that queries the mapping in DRAM 52 so as to obtain the physical storage locations that correspond to the requested logical addresses. Then, the operation reads the data from these physical storage locations in memory devices 28. A similar flow can be defined for write operations, as well. This technique enables the memory controller to perform logical-physical address translation with minimal internal memory and without having to store the mapping in non-volatile memory devices 28. The read/write speed of system 22 is improved considerably in comparison with storing the mapping in devices 28. The speed improvement is particularly high when performing a large number of random read/write operations.

Storing the logical-physical address mapping in the host memory is particularly advantageous in memory controller applications having limited internal memory, such as in μSD controllers. When using this technique, read and write operations do not involve extra read and write operations in order to determine the appropriate address translation and/or update the translation. As a result, read and write throughput are increased. In addition, the number of write operations and the amount of read disturb are reduced, and therefore the lifetime of the non-volatile memory is extended.

In many cases, the memory cells in devices 28 suffer from interference, for example cross-coupling interference from neighboring memory cells. In some embodiments, memory controller 32 applies an interference cancellation process when reading data from the memory cells. The interference cancellation process typically estimates and corrects the interference in a given group of memory cells based on the storage values or data of other memory cells (usually neighboring memory cells) in devices 28. Example interference cancellation techniques are described in PCT International Publications WO 2007/132453, WO 2007/132457 and WO 2008/026203, cited above.

In some embodiments, memory controller 32 retrieves the data of neighboring memory cells from DRAM 52. The memory controller supports a read operation that reads data from a given group of memory cells from memory devices 28, retrieves neighboring cell data from DRAM 52, and cancels the interference in the read data using the neighboring cell data obtained from DRAM 52. The neighboring cell data may be available in DRAM 52, for example, from the time the neighboring pages were stored. This technique relieves the memory controller from the need to read the neighboring memory cells from memory devices 28. As a result, the overall reading speed of system 22 can be improved.

In some embodiments, memory controller 32 uses the larger size of DRAM 52 in order to write larger amounts of data to memory devices 28 in a sequential manner. For example, the memory controller may support a block copyback operation that copies multiple pages (e.g., an entire erasure block) from a certain source location to a certain destination location in memory devices 28. When executing this command, the memory controller first reads the multiple pages sequentially from the source location and caches them in DRAM 52. Then, the memory controller reads the multiple pages from DRAM 52 and writes them sequentially to the destination location in memory devices 28. By reading and writing multiple pages sequentially instead of copying one page at a time, the duration of the copyback operation is reduced considerably. As another example, DRAM 52 can be used (either by the memory controller or by the host) to accumulate data for storage that arrives intermittently, until a sequential block of data is produced. The memory controller can then write the accumulated block sequentially to memory devices 28.

Additionally or alternatively, memory controller may store in DRAM 52 any other suitable information, and then use this information in accessing memory devices 28. Although the embodiments described herein refer mainly to DRAM resources, memory controller 32 may use any other suitable hardware resource of host system 24. Example resources are described further below.

Figure 2:
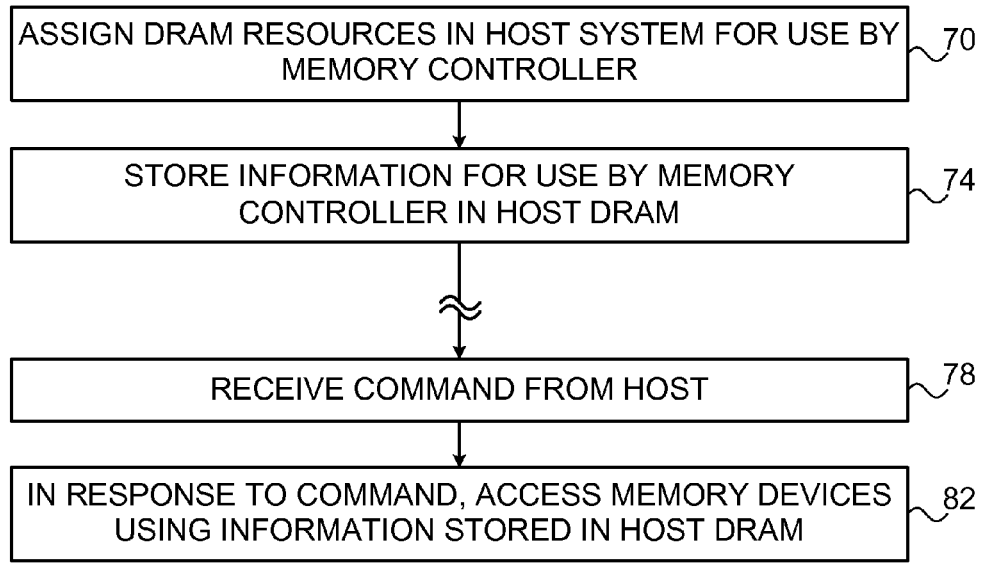
FIG. 2 is a flow chart that schematically illustrates a method for storing data in non-volatile memory using host system resources, in accordance with an embodiment of the present invention.

FIG. 2 is a flow chart that schematically illustrates a method for storing data in non-volatile memory devices 28 by memory controller 32 using DRAM resources of host system 24, in accordance with an embodiment of the present invention. The method begins by assigning storage space in DRAM 52 of host system 24 for use by memory controller 32, at a memory assignment step 70. Memory controller 32 stores in DRAM 52 information items relating to respective groups of analog memory cells of devices 28, at a DRAM storage step 74. As explained above, the information items may comprise storage parameters and configurations, logical-physical address mapping and/or neighboring cell data, for example.

At a certain point in time, memory controller 32 receives a command from host system 24, at a command reception step 78. The command causes the memory controller to access a given group of the analog memory cells of devices 28. For example, the command may request storage or readout of a certain data item. In response to the command, memory controller 32 executes an operation that accesses memory devices 28 using the information retrieved from DRAM 52, at an operation execution step 82. Typically, the memory controller identifies the group of analog memory cells to be accessed in devices 28, retrieves the (one or more) information items pertaining to this memory cell group from DRAM 52, and accesses the memory cells in the group using the retrieved information.

Interfaces Between the Host System and Memory Controller

When carrying out the above-mentioned techniques, memory controller 32 may store and read the information in DRAM 52 using any suitable interface. In the example of FIG. 1 above, the memory controller communicates directly with DRAM 52 using dedicated interface 60 (i.e., using a physical interface that is separate from the physical interface used for communication between the memory controller and the host processor). In these embodiments, retrieving information from DRAM 52 does not involve any operation of the host processor, since the memory controller and DRAM communicate directly. The memory controller and/or host system comprise suitable arbitration logic for controlling access to DRAM 52 by processor 44 and by processor 48.

In alternative embodiments, memory controller 32 stores and reads the information in DRAM 52 using host bus 56 (i.e., over the same physical interface used for communication between the memory controller and the host processor). Host bus 56 may operate in accordance with any suitable standard or protocol, such as, for example, the NAND interface, Micro-SD (μSD) interface, Embedded Multi-Media Card (eMMC) interface, Universal Flash Storage (UFS) interface, Serial Advanced Technology Attachment (SATA) interface, Universal Serial Bus (USB), Peripheral Component Interconnect Express (PCIe), or any other suitable interface.

The μSD interface is specified, for example, in "SD Specifications," Part 1, Physical Layer Specification, Version 3.01 Draft 1.00, Nov. 9, 2009, which is incorporated herein by reference. The eMMC interface is specified, for example, in "Embedded MultiMediaCard (eMMC) Mechanical Standard with Optional Reset Signal," JEDEC Standard JESD84-C44, July, 2009, which is incorporated herein by reference. The UFS interface is specified, for example, in "UFS Specification," version 0.1, Nov. 11, 2009, which is incorporated herein by reference. The SATA interface is specified, for example, in "Serial ATA Revision 3.0," Jun. 2, 2009, which is incorporated herein by reference. The USB interface is specified, for example, in "Universal Serial Bus Specification," Revision 2.0, Apr. 27, 2000, which is incorporated herein by reference.

In the above-listed communication protocols, the host processor is defined as a master and the memory controller is defined as a slave. As such, the memory controller is unable to initiate and send to the host processor commands requesting to store or retrieve information. In some embodiments, memory controller 32 requests host processor 48 to exchange information with DRAM 52, by signaling over a hardware line between the memory controller and the host processor. In some embodiments, a dedicated hardware line may be connected between the memory controller and host processor for this purpose. Alternatively, the memory controller may use an existing hardware line, such as a ready/busy line, for indicating to the host processor that data exchange is requested. Once the host processor receives this indication, it initiates the information exchange process.

Figure 3:
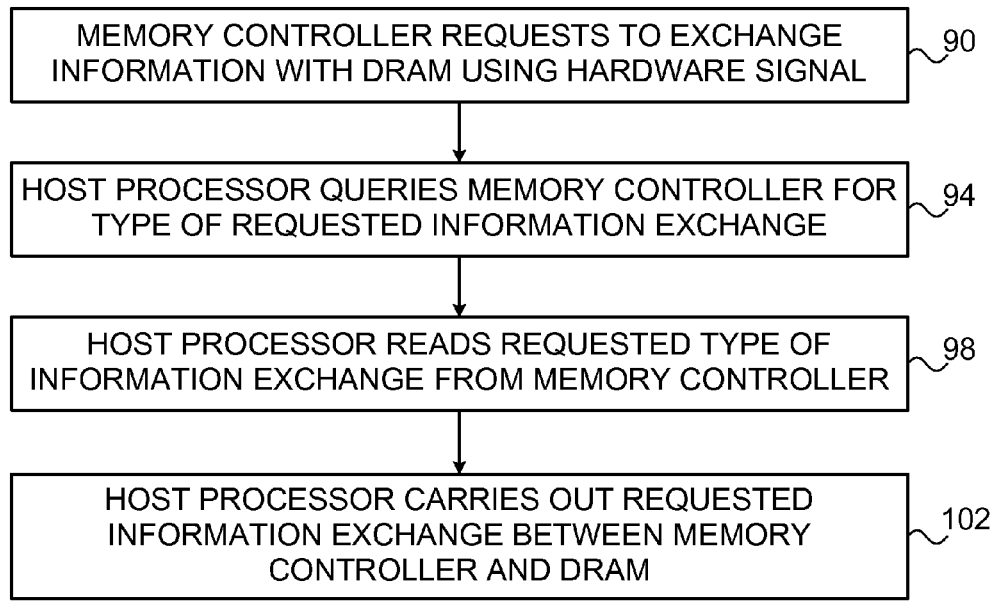
FIG. 3 is a flow chart that schematically illustrates a method for exchanging information between a host processor and a memory controller, in accordance with an embodiment of the present invention.

FIG. 3 is a flow chart that schematically illustrates a method for exchanging information between a host processor and a memory controller, in accordance with an embodiment of the present invention. The method begins with memory controller 32 indicating to host processor 48 that information exchange with DRAM 52 is requested, at an indication step 90. The memory controller signals this indication over a hardware signal (e.g., discrete hardware line or pin) connected between the memory controller and the host processor.

Upon receiving the indication, host processor 48 sends to memory controller 32 a message that queries the type of requested information exchange, at a querying step 94. The querying message requests the memory controller to indicate whether it requests to read information from the DRAM or to store information in the DRAM.

After sending the query message, host processor 48 reads from memory controller 32 data, which indicates the requested type of information exchange, at a readout step 98. For example, the data indicates whether the requested operation reads information from the DRAM or writes information to the DRAM. The data also indicates the range of addresses in DRAM 52 for reading or writing the information. When the request is for storing information in the DRAM, the data also comprises the information to be stored.

Based on the data read from the memory controller at step 98, the host processor carries out the requested information exchange, at an execution step 102. If the memory controller requested to store information in the DRAM, the host processor stores the information at the indicated addresses in the DRAM, and then sends an acknowledgement message to the memory controller. If the memory controller requested to read information from the DRAM, the host processor reads the information from the indicated addresses and sends the information to the memory controller.

In alternative embodiments, the memory controller may exchange information with the DRAM via the host processor using metadata that is included in the host commands and corresponding responses. The memory controller may request information from the DRAM, or send information for storage in the DRAM, by adding metadata to responses sent to the host system (e.g., results of read commands or acknowledgement or write commands). The host processor may send requested information from the DRAM to the memory controller as metadata, which is included in the read or write commands that the host system sends to the memory controller.

In some embodiments, the memory controller and the host processor exchange commands and responses that comprise the applicable DRAM information. For example, when the memory controller reads a certain memory page, it may send the read threshold values used in the read operation to the host processor, together with the read results. In response, the host processor stores the read threshold values in the DRAM. When the host processor sends a read command to the memory controller, it may send the applicable read threshold values (read from the DRAM) to the memory controller as part of the read command.

Although the embodiments described herein mainly address the use of host DRAM, the methods and systems described herein may utilize any other type of host memory, such as Static RAM (SRAM). Additionally or alternatively to assigning and using host memory, the memory controller may use various other resources of the host in order to access the non-volatile memory. For example, the memory controller may use hardware logic circuitry in the host to perform various logical operations (e.g., XOR operations or comparisons) as part of accessing the non-volatile memory. As another example, the memory controller may receive its supply voltage from the host. In such embodiments, the host may provide a stabilized, regulated and/or filtered supply voltage to the memory controller, such that the memory controller can minimize its on-chip regulation, stabilization and/or filtering circuitry. As a result, the power efficiency of the memory controller can be increased and its heat dissipation can be reduced. For example, the memory controller may receive a regulated 1.2V supply voltage from the host, instead of receiving a 1.8V or 3.3V supply voltage and reducing it internally.

As yet another example, the memory controller may invoke the host to perform interference cancellation computations on the data read from the non-volatile memory. In such embodiments, the host may be provided with the read results of one or more pages read from the non-volatile memory, as well as with the read results of neighboring pages. The host may then cancel the interference in the read results based on the read results of the neighboring pages, so as to produce interference-free data.

As still another example, the host can be invoked to perform ECC decoding. In some embodiments, a high-performance ECC decoder (e.g., a soft decoder) can be implemented in the host, using the higher inherent computational complexity of the host, and/or using dedicated hardware. In these embodiments, the memory controller provides the host with code words that are read from the non-volatile memory. The host then decodes the ECC, so as to reconstruct the data. In an example embodiment, the memory controller comprises a certain ECC decoder, and the host comprises another ECC decoder. The decoder in the host is more complex and has a higher error correction capability than the decoder in the memory controller. For example, the decoder in the memory controller may apply hard decoding, whereas the decoder in the host may apply soft decoding. In these embodiments, the memory controller initially attempts to decode a given code word using its local ECC decoder. If the initial attempt fails, the memory controller invokes the higher-performance ECC decoder in the host to decode the code word.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for data storage, comprising:
in a system that includes a host having a host memory and a memory controller that is separate from the host and stores data for the host in a non-volatile memory including multiple memory cells;
allocating a portion of the host memory for use by the memory controller;
sending a storage request, by the memory controller to the host, instructing the host to store, in the allocated portion of the host memory, information items relating to respective groups of the memory cells of the non-volatile memory;
storing, by the host, in the allocated portion of the host memory, the information items relating to the respective groups of the memory cells responsive to the storage request sent by the memory controller;
receiving, by the memory controller, from the host a command that causes the memory controller to access a given group of the memory cells;
sending, in response to the command, a retrieval request, by the memory controller to the host processor, instructing the host to retrieve from the allocated portion of the host memory by the memory controller a respective information item relating to the given group of the memory cells;
retrieving, by the host, from the allocated portion of the host memory, the information items relating to the respective groups of the memory cells responsive to the retrieval request sent by the memory controller; and
accessing the given group of the memory cells using the retrieved information item.

2. The method according to claim 1, wherein the host memory comprises a Random Access Memory (RAM).

3. The method according to claim 1, wherein the information items comprise read thresholds, and wherein accessing the given group comprises reading the memory cells in the group using one or more read thresholds retrieved from the host memory.

4. The method according to claim 1, wherein the information items comprise erase thresholds, and wherein accessing the given group comprises erasing the memory cells in the given group using one or more erase thresholds retrieved from the host memory.

5. The method according to claim 1, wherein the memory cells are programmed using a programming process, wherein the information items comprise parameters of the programming process, and wherein accessing the given group comprises programming the given group using one or more of the parameters that are retrieved from the host memory.

6. The method according to claim 5, wherein the programming process comprises an iterative Programming and Verification (P&V) process.

7. The method according to claim 1, wherein the information items are indicative of wear levels of the respective groups of the memory cells.

8. The method according to claim 1, wherein the information items are indicative of distortion levels in the respective groups of the memory cells.

9. The method according to claim 1, wherein the information items specify at least one attribute selected from a set of attributes consisting of a number of programming states, an Error Correction Code (ECC) and an ECC block size to be used in programming the respective groups of the memory cells.

10. The method according to claim 1, wherein the information items specify a relation between logical addresses and physical storage locations of the respective groups of the memory cells.

11. The method according to claim 1, wherein the information items are indicative of data stored in memory cells that neighbor the respective groups of the memory cells.

12. The method according to claim 1, wherein the common physical interface conforms to one of a NAND interface specification, a Micro-SD (μSD) interface specification, an Embedded Multi-Media Card (eMMC) interface specification, a Universal Flash Storage (UFS) interface specification, a Serial Advanced Technology Attachment (SATA) interface specification, a Universal Serial Bus (USB) interface specification and a Peripheral Component Interconnect (PCI) interface.

13. The method according to claim 1, wherein the sending of a storage request, by the memory controller, to the host, comprises sending a signal on a hardware connection from the memory controller to the host.

14. The method according to claim 1, wherein the sending, in response to the command, a retrieval request, by the memory controller, to the host comprises sending a signal on a hardware connection from the memory controller to the host.

15. The method according to claim 1, further comprising allocating another portion of the host memory to store program instructions and data.

16. A data storage apparatus, comprising:
a first interface, which is configured to communicate with a non-volatile memory that includes multiple memory cells;
a second interface, which is configured to communicate with a host having a host memory, wherein the host is configured to allocate a portion of the host memory for use by the data storage apparatus; and
a processor, which is configured to:
send a request to the host, instructing the host to store in the allocated portion of the host memory information items relating to respective groups of the analog memory cells of the non-volatile memory;
receive from the host a command that causes the processor to access a given group of the memory cells;
send, in response to the command, a retrieval request to the host, instructing the host to retrieve from the allocated portion of the host memory a respective information item relating to the given group of the memory cells;
receive from the host the retrieved information item relating to the given group of the memory cells; and
access the given group of the memory cells using the retrieved information item.

17. The apparatus according to claim 16, wherein the host memory comprises a Random Access Memory (RAM).

18. The apparatus according to claim 16, wherein the information items comprise read thresholds, and wherein the processor is configured to read the memory cells in the given group using one or more read thresholds retrieved from the host memory.

19. The apparatus according to claim 16, wherein the information items comprise erase thresholds, and wherein the processor is configured to erase the memory cells in the given group using one or more erase thresholds retrieved from the host memory.

20. The apparatus according to claim 16, wherein the memory cells are programmed using a programming process, wherein the information items comprise parameters of the programming process, and wherein the processor is configured to program the given group using one or more of the parameters that are retrieved from the host memory.

21. The apparatus according to claim 20, wherein the programming process comprises an iterative Programming and Verification (P&V) process.

22. The apparatus according to claim 16, wherein the information items are indicative of wear levels of the respective groups of the memory cells.

23. The apparatus according to claim 16, wherein the information items are indicative of distortion levels in the respective groups of the memory cells.

24. The apparatus according to claim 16, wherein the information items specify at least one attribute selected from a set of attributes consisting of a number of programming states and, Error Correction Code (ECC) and an ECC block size to be used in programming the respective groups of the memory cells.

25. The apparatus according to claim 16, wherein the information items specify a relation between logical addresses and physical storage locations of the respective groups of the memory cells.

26. The apparatus according to claim 16, wherein the information items are indicative of data stored in memory cells that neighbor the respective groups of the memory cells.

27. The apparatus according to claim 16, wherein the second interface conforms to one of a NAND interface specification, a Micro-SD (μSD) interface specification, an Embedded Multi-Media Card (eMMC) interface specification, a Universal Flash Storage (UFS) interface specification, a Serial Advanced Technology Attachment (SATA) interface specification, a Universal Serial Bus (USB) interface specification and a Peripheral Component Interconnect (PCI) interface.

28. The apparatus according to claim 16, wherein the processor is further configured to use a hardware signal to send the storage request to the host.

29. The apparatus according to claim 16, wherein the processor is further configured to use a hardware signal to send the retrieval request to the host.

30. The apparatus according to claim 16, wherein the host is further configured to allocate another portion of the host memory to store program instructions and data.

31. A data storage apparatus, comprising:
a non-volatile memory comprising multiple memory cells; and
a processor, which is configured to:
communicate with a host having a host memory, wherein the host is configured to allocate a portion of the host memory for use by the data storage apparatus;
send a storage request to the host, instructing the host to store in the host memory information items relating to respective groups of the memory cells of the non-volatile memory;
receive from the host a command that causes the processor to access a given group of the memory cells;
send, in response to the command, a retrieval request to host, instructing the host to retrieve from the host memory a respective information item relating to the given group of the memory cells;
receive from the host, the retrieved information item relating to the given group of the memory cells; and
access the given group of the memory cells using the retrieved information item.

32. The apparatus according to claim 31, wherein the host is further configured to allocate another portion of the host memory to store program instructions and data.

\* \* \* \* \*

UNITED STATES PATENT AND TRADEMARK OFFICE
CERTIFICATE OF CORRECTION

PATENT NO.       : 8,832,354 B2                                       Page 1 of 1
APPLICATION NO.  : 12/728287
DATED            : September 9, 2014
INVENTOR(S)      : Dotan Sokolov et al.

It is certified that error appears in the above-identified patent and that said Letters Patent is hereby corrected as shown below:

In the Claims:

Claim 16, Column 15, Line 40, please delete "analog"

Signed and Sealed this
Third Day of February, 2015

Michelle K. Lee
*Deputy Director of the United States Patent and Trademark Office*